(12) United States Patent
Parker et al.

(10) Patent No.: US 6,204,087 B1
(45) Date of Patent: Mar. 20, 2001

(54) FABRICATION OF THREE-DIMENSIONAL ARCHITECTURE FOR SOLID STATE RADIATION DETECTORS

(75) Inventors: Sherwood Parker, Berkeley; Christopher J. Kenney, Menlo Park, both of CA (US)

(73) Assignee: University of Hawai'i, Honolulu, HI (US)

(*) Notice: Subject to any disclaimer, the term of this patent is extended or adjusted under 35 U.S.C. 154(b) by 0 days.

(21) Appl. No.: 09/281,594

(22) Filed: Mar. 30, 1999

Related U.S. Application Data

(63) Continuation-in-part of application No. 08/796,273, filed on Feb. 7, 1997, now Pat. No. 5,889,313.

(51) Int. Cl.[7] ................................................... H01L 21/00
(52) U.S. Cl. ............................................................. 438/56
(58) Field of Search .................................. 438/56, 57, 91; 257/414, 428, 429; 250/370.09, 370.14

(56) References Cited

U.S. PATENT DOCUMENTS

| | | |
|---|---|---|
| 4,472,728 | 9/1984 | Grant et al. . |
| 4,618,380 * | 10/1986 | Alcorn et al. ........................... 438/73 |
| 5,027,182 | 6/1991 | Kim et al. . |
| 5,332,903 * | 7/1994 | Buehler et al. ................. 250/370.14 |
| 5,448,082 | 9/1995 | Kim . |
| 5,466,954 | 11/1995 | Aizpuru et al. . |
| 5,552,596 | 9/1996 | Ravetto et al. . |

* cited by examiner

Primary Examiner—Charles Bowers
Assistant Examiner—K Christianson
(74) Attorney, Agent, or Firm—Flehr Hohbach Test Albritton & Herbert LLP

(57) ABSTRACT

A radiation-damage resistant radiation detector with preferably three dimensional collection electrodes may be formed on a substrate that is a semiconductor or an insulator, and may be operated in avalanche mode to increase detection output. A detector comprising interleaved n-type and p-type preferably three dimensional electrodes formed in an area whose perimeter is an active trench. The trench is doped with dopant of opposite type polarity to that of the nearest electrodes, with respect to which the trench is reverse biased. The trench itself can act as a detector element, and the overall device exhibits edge-to-edge active detection. A plurality of such detectors may be arrayed in a plane to provide an essentially seamless large area detector suitable for medical and research applications, including synchrotron studies. Face-to-face bonding between ICs such as detector and readout ICs is carried out using a high yield vapor deposition process in which oxide room temperature bonds initially secure the two ICs. Using room temperature polymer deposition, IC surfaces may be protected during processing or, in final state, with a PFTE film.

13 Claims, 26 Drawing Sheets

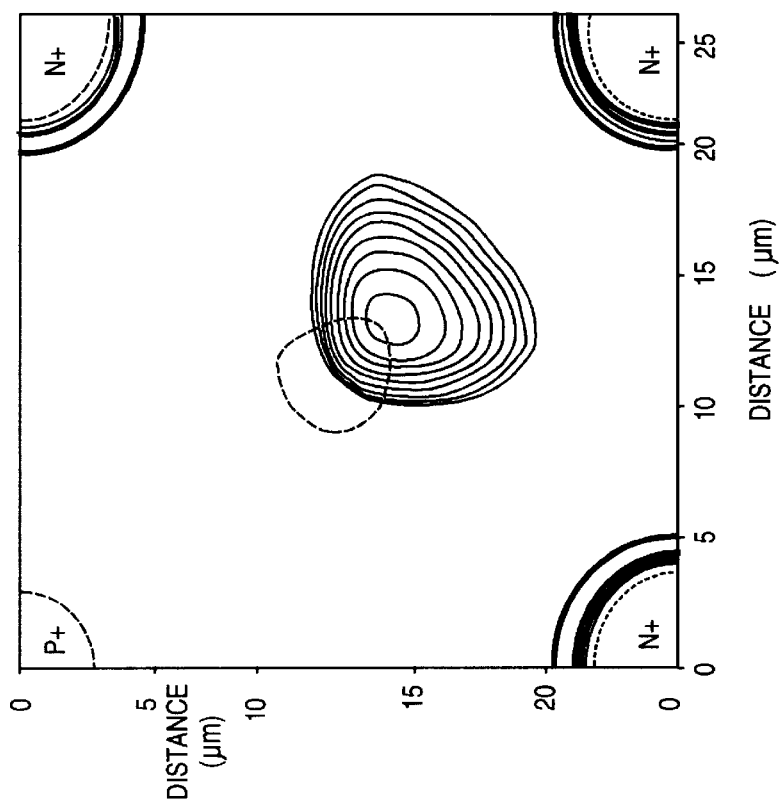
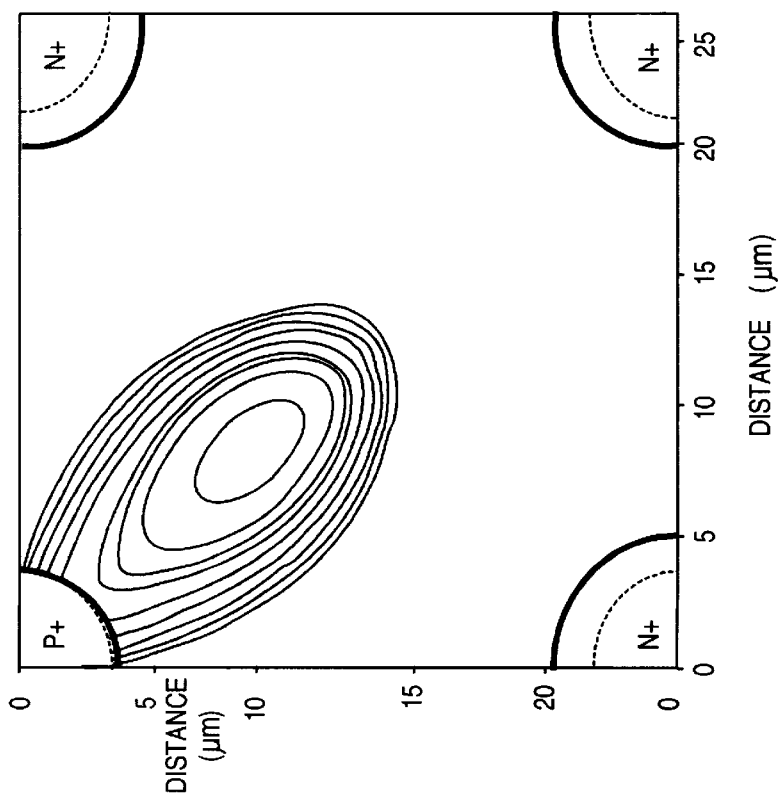
FIGURE 7C
FIGURE 7D

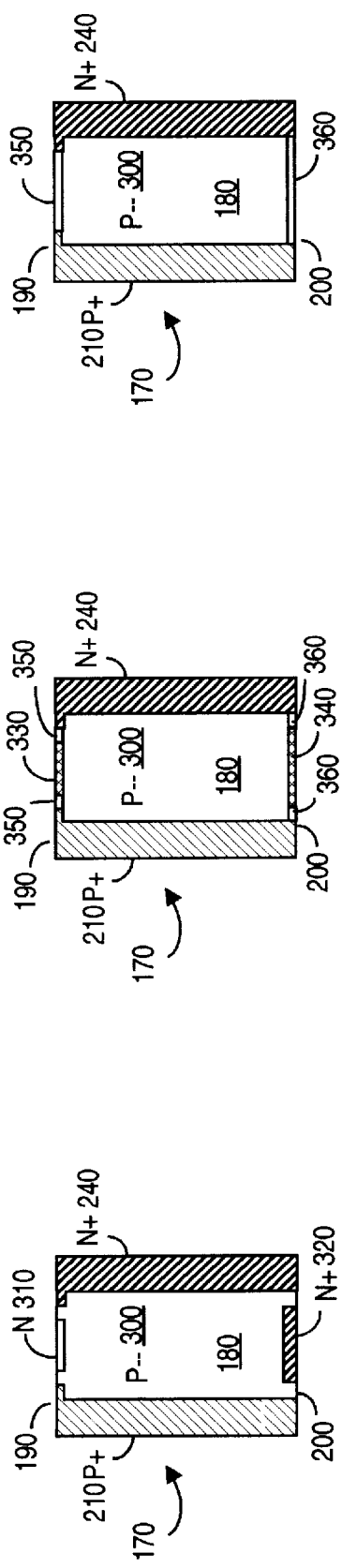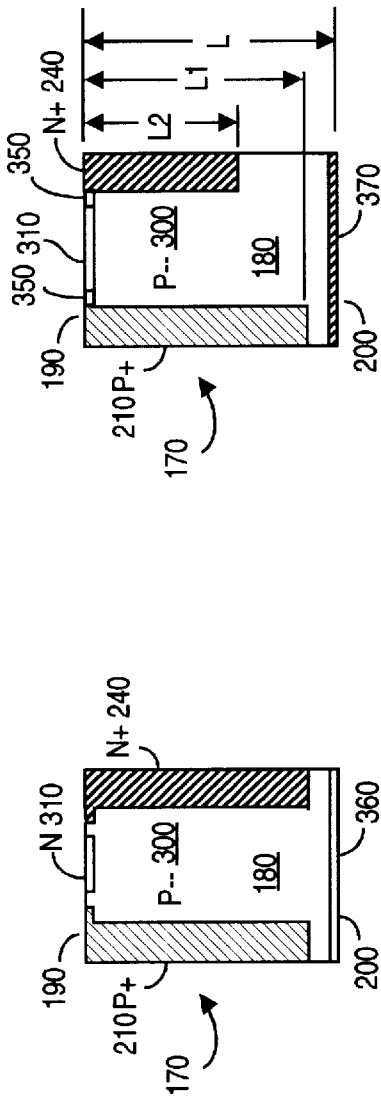

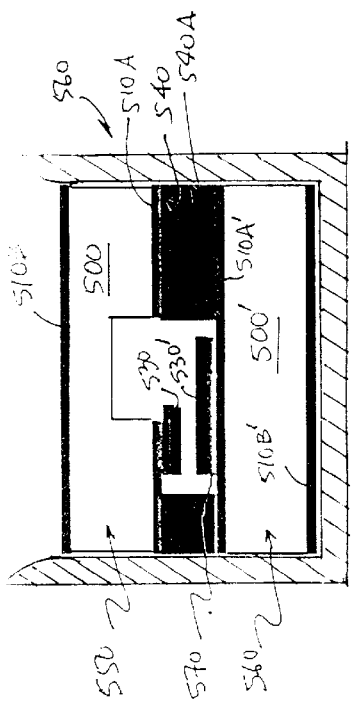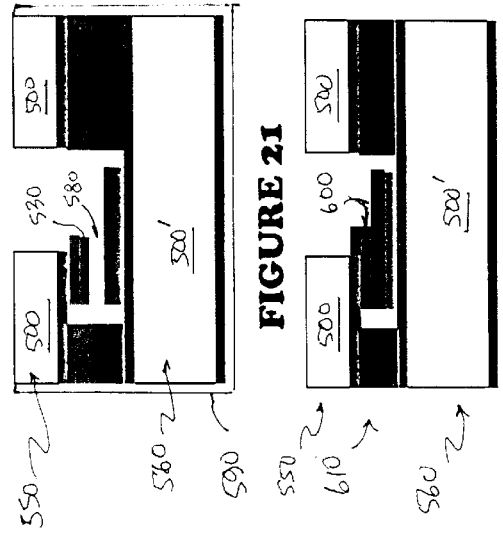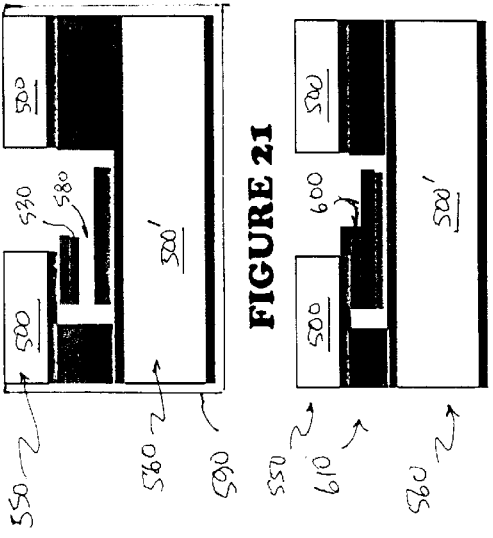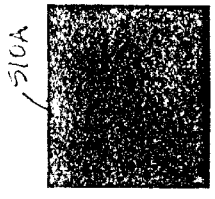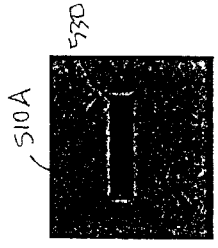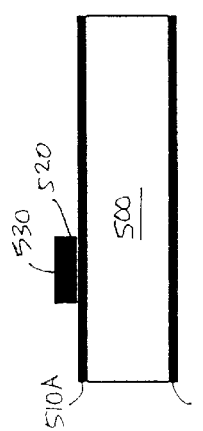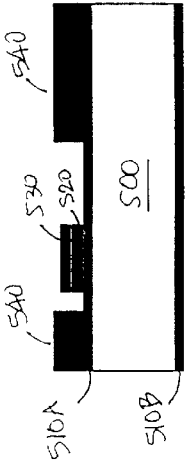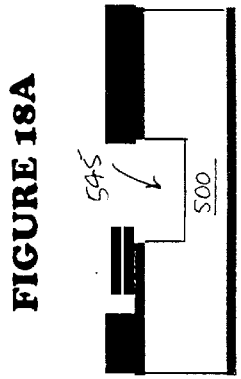

FABRICATION OF THREE-DIMENSIONAL ARCHITECTURE FOR SOLID STATE RADIATION DETECTORS

RELATION TO PREVIOUSLY FILED APPLICATION

This is a continuation-in-part-application from U.S. patent application Ser. No. 08/796,273 filed Feb. 7, 1997 for THREE-DIMENSIONAL ARCHITECTURE FOR SOLID STATE RADIATION DETECTORS, which issued on Mar. 30, 1999 as U.S. Pat. No. 5,889,313 of the research giving rise to the parent application were developed with support from the U.S. Department of Energy under grant DE-FG03-94ER40833, and the U.S. government may have rights to the within application.

FIELD OF THE INVENTION

The present invention relates to three-dimensional architecture for solid state devices including radiation detectors, as well as fabricating such devices that are active from chip edge-to-edge, that are operable in an avalanche mode, and that may be protected and/or combined with other chips using vapor deposition bonding.

BACKGROUND OF THE INVENTION

Solid state radiation detectors are known in the art, and provide a useful mechanism for detecting radiation. Such detectors have evolved from detectors using surface barrier electrodes, to ion-implanted electrodes.

Descriptions of such detectors and their uses may be found in applicant's article "A Proposed VLSI Pixel Device for Particle Detection", Nucl. Instr. and Meth. A275, 494 (1989), A342 59-77 (1994), and in U.S. Pat. Nos. 4,593,381, 5,237,197, 5,355,013, 5,461,653 and 5,465,002, among other references. FIG. 1 depicts such a prior art radiation detector 10, which is more fully disclosed in U.S. Pat. No. 5,237,197 (in which applicant herein is co-inventor). In FIG. 1, a detector array 10 includes a preferably lightly doped P-type charge depletable substrate 20, having first and second surfaces 30 and 40 spaced-apart by a substrate thickness L of perhaps a few hundred microns. Substrate thicknesses in this range provide good sensitivity for collecting radiation-generated charge from within the substrate, as well as providing acceptable voltage break-down levels, and protection from radiation damage.

Adjacent the first substrate surface 30 voltage-biasable doped well regions 50 of preferably N-type material are formed. Buffer well region 55 is formed of N-type or P-type material, depending upon the nature of the circuitry 60 in this well region. Well regions 50, 55 preferably are sufficiently highly doped to act as an electrostatic shield for underlying regions of the detection device. Electronics 60 may be fabricated within buffer well region 55.

Also adjacent first substrate surface 30 and separated from each other by the N-type well regions 50 are formed spaced-apart collection electrodes 70, preferably made from highly doped P-type material. Preferably the gate lead of one (or more than one) metal-oxide-semiconductor ("MOS") transistor 80 is coupled to each collection electrode 70. The lower surface of the substrate includes a preferably heavily doped N-diffusion region 90, beneath which is an electrode (not shown), and isolation regions 100. Of course, the conductivity types of the materials used to form detector 10 could be reversed, e.g., substituting P-type for N-type and vice versa.

One collection electrode 70, its associated MOS device 80, and indeed the associated underlying semiconductor structure may collectively be termed a "pixel", and the terms pixel and detector may be used interchangeably. It is seen from FIG. 1 that P-type collection electrodes 70 and P-type substrate 20 form a plurality of PN diode junctions with the N-type well regions 50 adjacent the first surface.

In practice, a well bias voltage of many volts is coupled between the collection electrode regions and bottom regions and N-doped well regions. The resultant electric fields extend from the second surface 40 toward and to the first surface 30. The resultant depletion region extends through the perhaps 300 $\mu$m thickness of the substrate, whereupon a plurality of P-I-N diodes are formed by P-type collection regions 60, intrinsic substrate region 20, and N-type region 90.

The biasing causes force lines to emanate from the N-diffusion region 90 through the substrate thickness and focus upon the P-type collection electrodes 70. Incoming radiation (not shown) releases charge within the substrate, which charge is focused by the force lines and caused to be collected by the electrodes 70. As noted, N-wells 50 further serve as a Faraday shield for the array of pixels in structure 10. As noted, well regions 50, 55 can also serve as areas in which electronics are fabricated. Unfortunately, CMOS electronics that require wells of both dopant conductivity types can present a problem. Such CMOS electronics can be accommodated in the area over the active detection region, providing wells of like-conductivity type as the collection electrodes are implanted completely within wells of the opposite conductivity type. Understandably, if same-type wells were to be formed directly on the depleted silicon substrate, the wells would collect ionization charge on the substrate, which charges would not be collected and detected by the collection electrodes and assorted circuitry.

As described in the U.S. Pat. No. 5,237,197, detector 10 can nonetheless function reasonably well because the wells surrounding the collection electrodes were doped with opposite type dopant and were back-biased relative to the collection electrodes. This configuration caused electric field lines to be directed to carry one sign of ionization charge from the substrate and the well to the collection electrodes. Like-signal wells, needed for CMOS electronics, were placed along the structure edges, beyond the sensitive detection area. Even though only perhaps 10% of upper surface 30 may be covered by collection electrodes, efficiency in the sensitive region is extremely high with more than 99.99% of the radiation-induced charges being collected by electrodes 70. The collection electrodes preferably are uniformly distributed in a two-dimensional array on the surface, to provide resultant uniform array sensitivity and spatial resolution.

Once the radiation-induced charge has; been collected by the collection electrodes 70, the transfer to an associated MOS device(s) can be rapid as the distance is now but a few microns. Further, because there is small capacitance (C) at the MOS gate, the charge (q) developed by the incoming X-ray radiation can produce a substantial voltage signal (v), since v≈q/C. Electronics 60 may be used to signal process the charge associated with the MOS devices. For example the collected charge at a MOS gate may be used to modulate readout current caused to flow through the MOS device. Such readout may be made on an addressable row-column basis.

As noted, radiation detection sensitivity for prior art detector 10 can be very high. But radiation-induced charge cannot be detected until it has been collected by the surface-located collection electrodes 70. Unfortunately the collection or drift path that released charge must traverse before being collected can be very long, e.g., comparable to the few hundred micron full substrate thickness. Of course should some radiation-generated charge happen to be released closer to the collection electrode surface, collection of the charge can occur in a shorter time. In practice, prior art detectors using two-dimensional electrodes such as shown in FIG. 1, or the common silicon strip technology that preceded what is shown in FIG. 1, may take upwards of 25 ns for charge-produced signals to return to a baseline level from a peak. Of course, amplifier delays may extend this time even further.

Attempting to reduce radiation detection time by using a thinner substrate is counter productive because thinner substrates have shorter tracks, and therefor less signal charge. Also, thinner materials can break more readily during fabrication. It would also be desirable to provide a detector structure, that is kept small in size in the presence of radiation damage, requiring a smaller voltage magnitude to achieve depletion, while still preventing so-called bulk type-reversals. Finally, in many detection environments it is necessary to continuously refrigerate the detector, even for maintenance.

U.S. Pat. No. 5,889,313 provided a sensitive solid state radiation detector having such improved detection response times, with good voltage breakdown, without requiring excessively high depletion voltages, while still exhibit good radiation damage resistance characteristics. The resultant detector permitted implementation as a monolithic combination of collection electrodes and CMOS electronics, without thereby hindering collection of released charge and functioned without requiring operation at low temperature to prevent radiation damage effects.

Notwithstanding their improved performance, such detectors (not unlike other prior art detectors) would not typically be fabricated such that substantially the entire surface of an IC chip could be detection-active, literally from chip edge-to-edge. It is normal to leave a wafer-area safety margin surrounding detectors, especially planar detectors, for several reasons. The depletion region and associated electric field tend to bulge out from the last electrodes (e.g., those nearest a detector edge). When the detector is sawed from the IC wafer, the passivated saw cuts (and any resulting chips or cracks in the wafer edge) must not reach or interfere with such bulges and thus a margin of detection-inactive area is left between the end detectors and the raw edge of the IC. It is also common IC fabrication practice to provide guard and/or voltage dropping rings around active regions including detectors. Fabrication such rings requires IC area that could otherwise perhaps be made available for active detection. Presenting a larger overall detection area by combining multiple detector arrays typically requires multiple overlapping detectors. Accommodating the overlap area also requires inactive area on the detector IC. Thus, due to a variety of reasons, the detection-inactive (e.g., dead) area on a detector IC may represent 10% to 20% or more of the IC area that might otherwise be used for active detection.

Understandably, it would be desirable to fabricate a detector IC that was detection-active from edge-to-edge. Not only would such an IC provide a greater detection area for a given IC size, but combining many such ICs in a preferably tiled planar array (although non-planar could be used) could be carried out without dead space surrounding each individual detector IC. Indeed, it would also be highly useful if the vertical chip edge surfaces could also be rendered detection sensitive.

Regardless of whether edge-active detection is available, it would be useful for a radiation detector to output a larger signal. Such an enhanced output signal detector would find use in applications where existing signal strength is too marginal, or requires overly sophisticated amplification and signal processing. Preferably such increased signal output mode should be accomplished without substantial modification to the detector, preferably by operating the detector in a different bias regime.

Although conventionally radiation detectors, including those described in U.S. Pat. No. 5,889,313 have electrodes formed in a semiconductor substrate, it would be useful to provide detectors formed in a substrate that was not necessarily even semiconducting, including for example, insulating or near-insulating semiconductors. Rather than being formed with P-I-N structures, such devices would be characterized as having conductor-insulator-conductor structures and would have essentially no leakage currents.

As noted in U.S. Pat. No. 5,889,313, it is often necessary to interconnect different ICs, perhaps a detector IC and a second IC containing electronics, perhaps readout circuitry. In practice it can be difficult to mechanically and electrically make such interconnections. Bump bond interconnections often involve the presence of indium or gold, whose mobile atoms can detrimentally affect MOS device performance, and bond leads. Bump bonding chips cannot be placed in intimate contact with each other, which gives rise to higher interconnect capacitances. Further bump bonding yields are typically in the 90% range. What is needed is a method whereby such mechanical and electrical interconnections can be made with very high reliability, preferably using IC fabrication equipment normally found in a fabrication site.

Finally, it can be useful to provide ICs including electronics for three-dimensional detectors with an oversurface layer or film that can protect the underlying structure, especially for use in a hostile environment. Preferably such layer or film should be formed at room temperature using fabrication techniques and equipment that are presently available. Preferably such film would also lend itself to micromechanical devices, as well as sensors and other ICs. Anisotropic silicon wet etching is widely used in the industry, especially for bulk micro-machining and micro-electromechanical systems (or "MEMS"). While such etching an inexpensively selectively remove large volumes of silicon, a mask layer of silicon dioxide or silicon nitride is required. Such masking requires several steps extending hours while these materials are grown or deposited, often at high temperature. Further, different anisotropic etchants are selective to different masking layers, e.g., KOH deep etching requires a silicon nitride mask). Thus, specific etchants must be paired with specific masking layers, which contributes to manufacturing complexity and/or to the manner in which the component parts can be made. Further, aluminum and polysilicon are attacked by most common anisotropic etchants, and must be protected during a silicon etch, after which windows must be formed in the masking layer. Finally, it is often desired to etch only one side of a wafer, during which process the other wafer side must be protected, either mechanically or by deposition and masking an additional layer on the side to be protected, and then removing the protective layer after bulk etching on the other side.

The present invention provides such a detector and mode of detector operation.

SUMMARY OF THE INVENTION

U.S. Patent No. 5,889,313 provided a three-dimensional solid-state radiation detector fabricated on a substrate formed of a material doped with a first conductivity type dopant, whose first and second surfaces are separated by the bulk thickness, which may be several hundred microns. The detector included at least one first electrode formed of the same first conductivity type dopant and penetrating from one of the surfaces at least partially into if not completely through the substrate bulk. The detector further included at least a one second electrode that is spaced-apart from the first electrode. The second electrode was formed of an opposite conductivity type dopant and penetrates from either of the surfaces at least partially into if not completely through the substrate bulk.

Preferably the three-dimensional electrodes penetrated entirely through the substrate bulk. As a result, detectable particulate and/or electromagnetic radiation that penetrated at least one substrate surface and released electrons and holes in substrate regions at a relatively small distance from at least a portion of one of the electrodes. Accordingly, radiation-induced electrons and/or holes had to traverse a small distance before being collected by an electrode, which enabled rapid detection of the incoming radiation. Electrons and/or holes traversing the small distance were collected by the electrodes an order of magnitude faster than if a prior art two-dimension electrode detector had been used.

The electrodes may be formed by first defining electrode column-like holes in the substrate, and then filling the holes and making them conductive, for silicon-based detectors, preferably with silane-produced polysilicon that is doped. Electrodes with a dopant profile radially graded in a direction parallel to a substrate surface will have an electric field that promotes self-depletion and rapid collection of released electrons and holes. Alternatively, first electrodes might be formed using a suitably high energy ion implanter to implant first conductivity type dopant through openings in a first mask. Next, opposite conductivity type dopant is implanted through openings in a second mask to form the second electrodes.

An externally applied potential normally will be coupled between the first and second electrodes to further promote substrate depletion and to increase the inter-electrode electric field magnitude present to help guide release charge to adjacent electrodes for collection.

The disclosed three-dimensional architecture advantageously permits a monolithic combination of collection electrodes and CMOS electronics. The well structure for the CMOS electronics is such that substantially all charge is collected by the collection electrodes. As a result, only a small fraction of charges remain to be collected by the well structure, and thus lost for measurement purposes.

In one embodiment, radiation detectors including detectors described in U.S. Pat. No. 5,889,313 are intentionally biased to enter avalanche mode. Avalanche mode is promoted by using higher inter-electrode peak fields than were described in the U.S. Pat. No. 5,389,313, perhaps tens of times higher, by increasing electrode voltages and/or decreasing diameter or transverse dimension of the collection electrodes, preferably reducing electrode cross-section dimension to a few μm. Avalanche mode is also promoted by forming a sharp dopant profile near the collection electrodes, e.g., by using arsenic dopant, which does not diffuse far. However created, the resultant high electric fields force promote avalanche mode operation whereby radiation-induced charges essentially avalanche or multiply, causing the detector to output a larger signal for a given magnitude of detected charge than would be the case for normally biased detectors.

It is now recognized that a non-conducting substrate or a near-insulating substrate may be used to fabricate the present invention, rather than a semiconducting substrate as disclosed in the U.S. Pat. No. 5,889,313. Using a non-conducting material such as GaAs, diamond, or silicon carbide as a substrate, leakage currents are essentially eliminated.

In another embodiment, detectors are formed that are active over essentially all of the IC surface area, essentially from chip edge-to-edge. Such detectors not only provide more collection electrodes per given IC area, but are readily tiled to form large detector arrays that can form a single plane, without wasting IC area at chip peripheries. (However, if desired, a larger detector having non-planar surfaces could be formed by intentionally overlapping applicants' edge-to-edge detectors, for example, to define a somewhat spherical surface.) Such detectors are fabricated by forming trenches at what will be the chip periphery, and then partially filling and doping the trenches and then sawing the trenches vertically through the center of the trench wall. Trench depth preferably will be as great as the thickness of the substrate, which may or may not be semiconductor material.

In plan view, the trenches may have any cross-sectional shape and need not be rectangular or otherwise regular in cross-section. The trenches preferably are formed using etching, after which the trench is partially filled (e.g., with polysilicon) and doped (n-type or p-type dopant) to form a trench electrode whose depth may be the several hundred micron depth of the semiconducting or non-semiconducting substrate. If the trench has not been preferentially etched all the way through, the trench may then be sawed through the center of the partially filled and doped trench walls.

The exterior portion of the wall is cut-away and discarded, and the interior portion of the trench wall remains as an active electrode, albeit with large capacitance due to its size. Disposed within the area defined by the trench electrode perimeter are interleaved three-dimensional electrodes, such as those described in the U.S. Pat. No. 5,889,313. A plurality of detector cells, each comprising preferably interleaved three-dimensional electrodes surrounded by an active trench electrode may be joined together in a tile-like fashion to form a large planar detecting array. The trench surrounds an area containing interleaved p-type and n-type electrodes, some or all of which are three-dimensional electrodes. Polarity of the doped trench is opposite to polarity of the electrode types nearest the trench. The trench potential is such as to reverse bias relative to the nearest opposite polarity type electrodes.

In this embodiment, the resultant detectors are active over essentially all of the IC surface area, essentially from chip edge-to-edge. Indeed, the active trench 420 walls may themselves be collectors. Such detectors not only provide more collection electrodes per given IC area, but are readily tiled to form large detector arrays, without wasting IC area at chip peripheries.

In another embodiment, room temperature vapor bonding is used to make mechanical interconnections between facing ICs, for example a large detector IC upon whose surface is mounted a plurality of smaller readout ICs. The smaller ICs are formed on a thick substrate and aluminum metal traces are cleaned and deposited with tungsten, after which low temperature oxide is formed and then, etching is used to form vias. This IC is then inverted and placed in alignment over a relevant region of the larger IC, which also has uppermost oxide regions and tungsten coated metal traces.

Room temperature bonding between the oxide layers initially secures the two ICs, and smaller IC substrate is thinned through the bottom of the vias. A chemical vapor deposition of tungsten row completes the tungsten-to-tungsten interconnections between the two ICs. A 350° C. bake can then render the bonds more permanent.

In yet another embodiment, a room temperature polymer deposition technique is described, whereby the upper surface of an IC may be protected during processing or, in final state, with a film layer against hostile environmental agents. The film or layer can be applied as a thin low-stress film, an important consideration for micromechanical devices and applications.

Other features and advantages of the invention will appear from the following description in which the preferred embodiments have been set forth in detail, in conjunction with the accompanying drawings.

BRIEF DESCRIPTION OF THE DRAWINGS

FIGS. 5A–15C depict electric field magnitudes along different lines for a quarter-cell configuration, according to the present invention;

FIG. 6 depicts lines of equal drift time for potential distributions for a quarter-cell, according to the present invention;

FIGS. 7A–7L depict charge density contours for electron-hole pairs in a quarter-cell having 10 V potential, $10^{12}$/cc dopant concentration, according to the present invention;

FIGS. 10D, 10E, 10F, 10G, and 10H are side views of various detector structures, according to the present invention;

FIG. 11 depicts equipotentials for the cell shown in FIG. 10A, according to the present invention;

FIG. 13 depicts equipotentials for the cell of FIG. 10C, according to the present invention;

FIG. 15 is a plan view of a detector array comprising tiled detector portions such as shown in FIG. 14C, in which the array and its component detectors is active edge-to-edge, according to the present invention;

FIGS. 16A and 16B are side and plan views of a IC chip portion to be bonded to another IC chip, according to the present invention;

FIGS. 17A and 17B are side and plan views of the IC chip portion of FIGS. 16A and 16B after deposition of tungsten atop cleaned aluminum, according to the present invention;

FIGS. 18A and 18B are side and plan views of the IC chip portion of FIGS. 17A and 17B after low temperature oxide deposition and patterning, according to the present invention;

FIG. 19 is a side view of the IC chip portion of FIG. 18A after anisotropic oxide and silicon via etching, according to the present invention;

FIG. 20 is a side view depicting jig-alignment of a second IC chip portion and the inverted IC chip portion of FIG. 19, for fusion bonding and annealing, according to the present invention;

FIG. 21 is a side view depicting the bonded chip portion pair of FIG. 20 after the second IC chip portion has been thinned, according to the present invention;

FIG. 22 is a side view depicting the configuration of FIG. 21 after chemical vapor deposition of tungsten to electrically interconnect relevant segments of the two chip portions, according to the present invention.

DETAILED DESCRIPTION OF THE PREFERRED EMBODIMENTS

The present invention provides architecture for solid-state radiation detectors in which a three-dimensional array of electrodes penetrates into and possibly entirely through the substrate bulk. The resultant structure reduces charge collection distances and calculated collection times by about one order of magnitude relative to what is realized using prior art planar technology strip and pixel detectors with detector surface electrodes. In addition, the three-dimensional architecture permits use of depletion voltages that are about one-to-two orders of magnitude lower that what is required for prior art detectors. Further, the disclosed architecture enables maximum substrate thickness, often an important consideration for x-ray and gamma-ray detection, to be constrained by the electrode length, rather than by material purity or depletion-depth limitations due to voltage breakdown.

A three-dimensional solid-state detector according to the present invention has increased resistance to radiation damage. As such, the detector is especially useful in environments such as high intensity colliders, wherein prior art detectors would experience severe bulk radiation damage rendering them inoperable.

Figure 1:
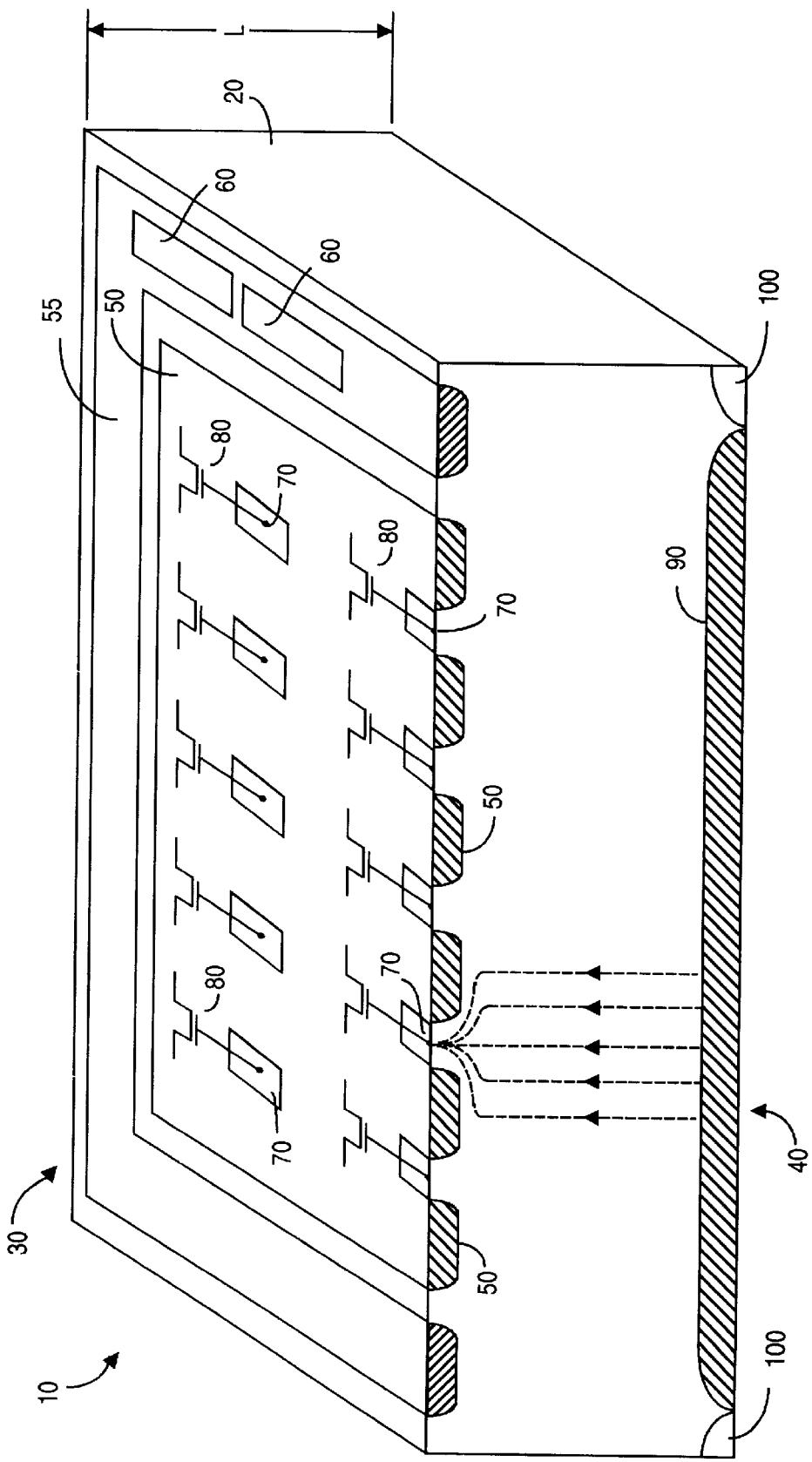
FIG. 1 depicts a radiation detector, according to the prior art.
Figure 2A:
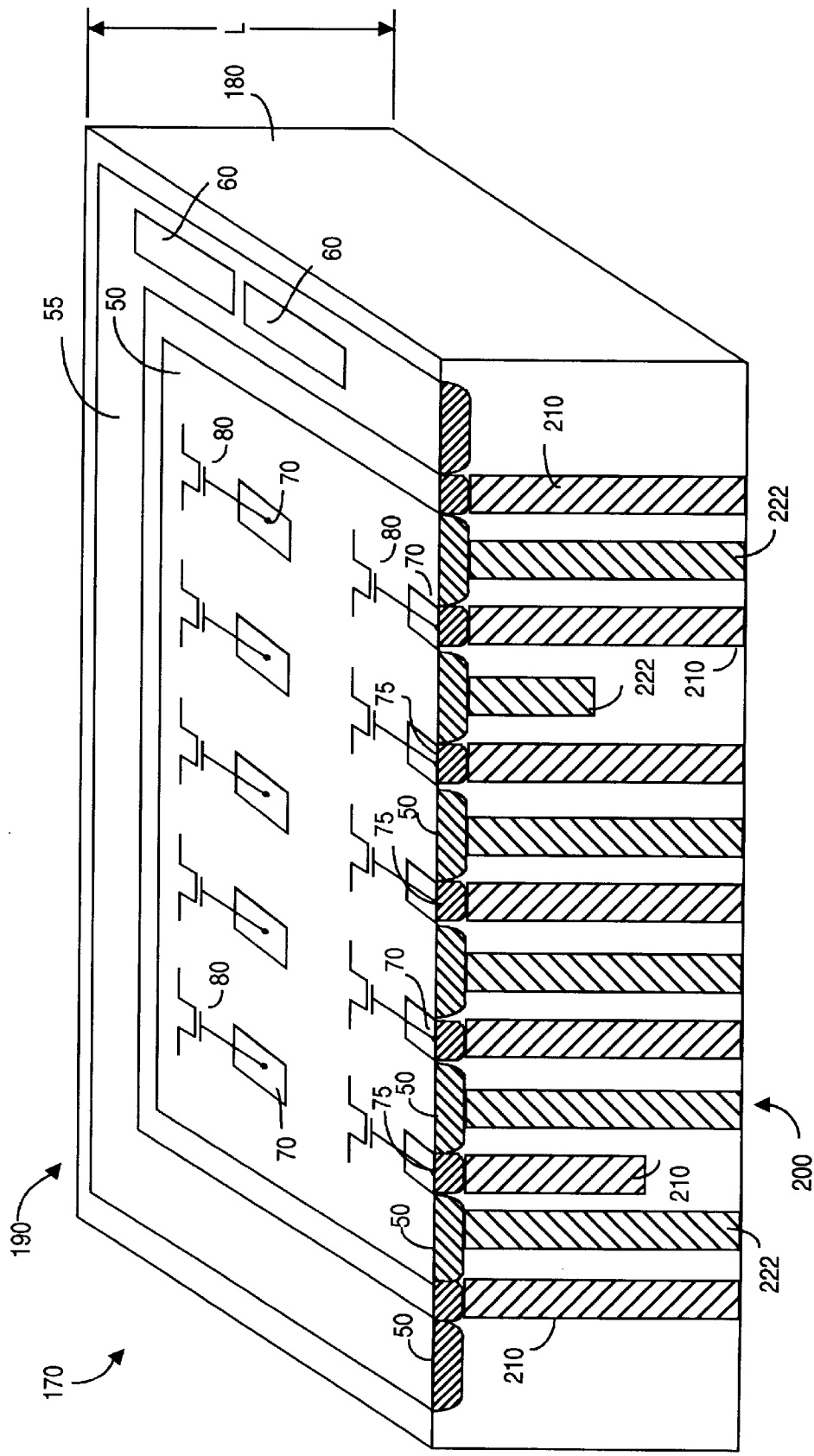
FIG. 2A depicts a monolithic structure with radiation detectors with three-dimensional collection electrodes, according to the present invention.

FIG. 2A depicts a monolithic structure embodiment of a radiation-damage resistant radiation detector 170 according to the present invention. However, it is to be understood that non-monolithic detector systems may also be realized with the present invention. Detector 170 is formed on a preferably lightly doped P-type charge depletable substrate 180 having spaced-apart first and second surfaces 190 and 200 and a substrate thickness L that is perhaps a few hundred microns. In contrast to the two-dimensional electrode array of prior art FIG. 1, note in FIG. 2A that P-type electrodes 210 descend from P-implants (or wells) that serve as collection electrodes 75 formed from the upper substrate surface 190 substantially into if not completely through the substrate thickness to the lower surface 200. Note too that N-type electrodes 222 descend from N-wells 50 formed at the upper substrate surface and descend substantially into if not completely through the substrate thickness. CMOS type circuitry may advantageously be disposed within well 50 and/or wells 55 (it being understood that wells 55 may include P-type, and/or N-type structures, depending upon the nature of the electronics to be included), to measure charge from collection electrodes, e.g., 210, as well as to signal process resultant charge signals.

Figure 2B:
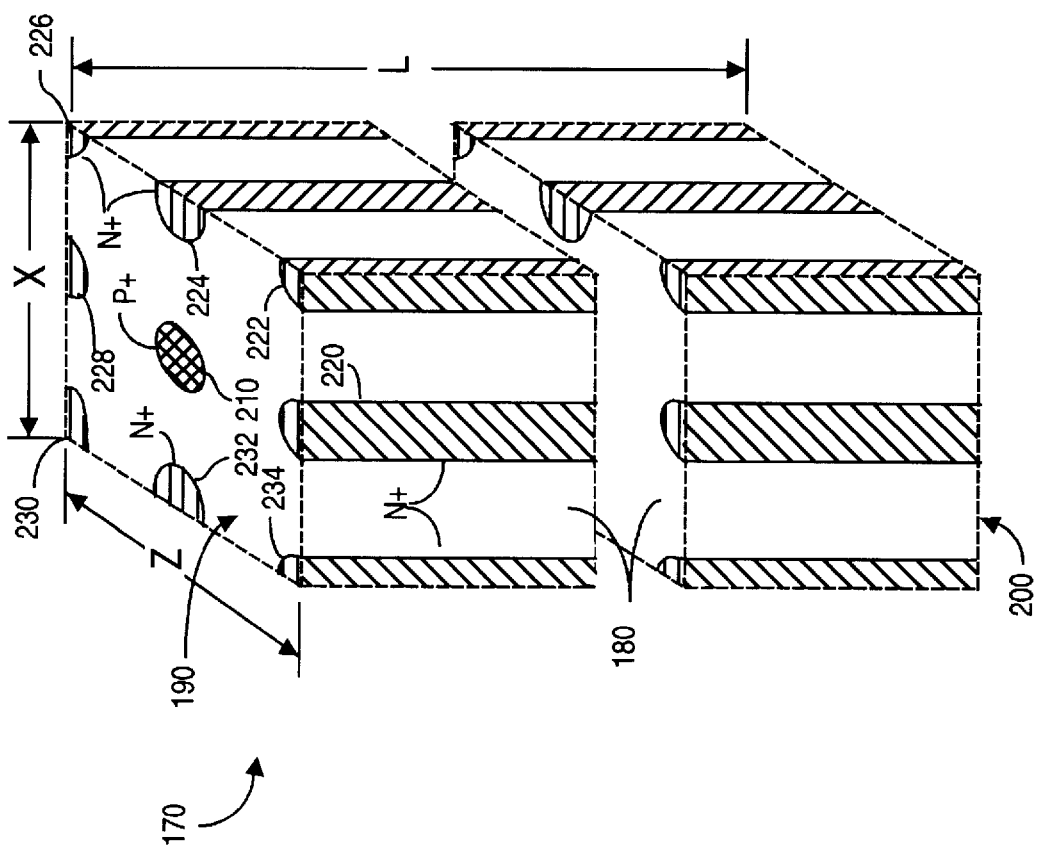
FIG. 2B depicts a single cell portion of a basic radiation detector, according to the present invention.

FIG. 2B depicts a quarter-cell portion of a unit basic radiation detector such as detector 170. For clarity in FIG. 2B, detector 170 is formed on a substrate bulk 180 having spaced-apart first and second surfaces 190 and 200. Detector 170 is shown as though cut in half length-wise, with the two halves slightly pulled apart to provide a better understanding of the structure. Substrate thickness L is perhaps a few hundred microns, and the X and Z dimensions of the unit detector cell shown in FIG. 2B may be in the range of perhaps 20–100 $\mu$m. Of course different X, Y, and/or L dimensions may be used.

Extending into if not through the detector bulk are one or more electrodes, including a preferably P+ doped electrode 210, and N+ electrodes shown as 220, 222, 224, 226, 228, 230, 232, and 234. The electrode spaced-apart distance or pitch typically may range from about 10 gm at present (and likely 5 $\mu$m or less in a few years as better fabrication equipment is available) up to a distance comparable to substrate thickness L. The electrode depth may be a small fraction of the total substrate thickness L, perhaps 5%, but preferably the electrode depth (or length) is equal to the entire substrate thickness, e.g., 100%. Through-substrate electrode lengths are preferred as the resulting short charge collection distances provide fast charge collection while permitting use of low depletion voltages.

The quarter-cell configuration of FIG. 2A was examined as to voltage distributions, using MEDICI modeling software available from Technology Modeling Associates Inc., of Palo Alto, Calif. Calculations were also made using a sequential-over-relaxation method described by K. Binns and P. Lawrenson, "Analysis and computation of electric and magnetic field problems, (Pergamon, 1973) p. 241. (For the latter analysis, symmetric boundary conditions (Vi+1, j,k)=V(i−1, j,k) were used for the (cubic) cells, on either side of a boundary at a plane inconstant, where V represents voltages at cell centers. At silicon-insulator boundaries, a next voltage for any cube is found from the average of the four adjoining voltages on the boundary and the adjoining voltage further into the silicon (plus the usual term from fixed charges). This reflects that in equilibrium, there is no net charge transport into the cube. Thus, the sum of current across, the five cell faces, as well as the five voltage differences, are zero. In this approximation, surface currents were neglected, and effects of induced charges were calculated using Ramo's theorem as set forth in S. Ramo, "Currents induced by electron motion", Proc. of the I.R.E., 27 (1939) 584. Coulomb forces were approximated by subdividing 24,000 electron-hole pairs from a typical minimumionization track into packets of 40 charges each, which diffused and drifted as a group. Results did not change significantly when the packet size was changed.

Of the two computation methods, presently only MEDICI can calculate fields and current flow in the presence of surfaces and undepleted silicon. When both methods could be used to analyze the same problem, results generally agreed.

Depletion voltages for the sample diode shown in FIG. 2B were 1.6V, 1.8V, 3.8V, and 8.8V for dopant concentrations of $10^{12}$, $3\times10^{12}$, $10^{13}$, and $3\times10^{13}$ dopant atoms/cc., including a contribution from the built-in voltage at the electrodes ranging from about 0.7V to 0.8V. The values are not proportional to the dopant concentrations because in the course of fully depleting the lightly doped silicon substrate, part of the heavily doped region around the electrodes is also depleted. Applicant's prototype pixel detectors had a doping concentration of $1.2\times10^{12}$ dopant atoms/cc. It is anticipated that a 10 year exposure for such pixel detectors in a potentially bulk-damaging environment would not increase doping much beyond about $10^{13}$ dopant atoms/cc.

As noted, because the path from a radiation-induced charge to a nearest collection electrode can be substantially shorter than the distance L, collection times for detector 170 are rather fast. Rapid collection time is especially useful in a quantum mammography system proposed by applicant, in which individual x-ray radiation hit locations are recorded. Further, the dual benefits of fast collection and low depletion voltage will be particularly useful in high luminosity collider environments, in which prior art detectors face severe problems both from high event rates and from increased depletion voltages due to bulk radiation damage. Use of detection devices according to the present invention will advantageously eliminate the need for high depletion voltages, and the need to refrigerate the detector continuously, even during maintenance.

Fabrication of a detector according to the present invention can be carried out as follows. Initially column-like like holes are formed in substrate 180. These holes penetrate from the substrate surface 190 at least partially into the substrate bulk, and preferably entirely through the substrate bulk, e.g., through lower bulk surface 200. Preferably these holes define cross-sectional dimensions having a transverse dimension ranging from about 0.5 $\mu$m to about 25 $\mu$m. As noted, the columnar length of these hole openings may vary from about 5% to preferably 100% of the substrate thickness.

Aside from fabrication equipment capabilities, other factors should also be considered in deciding diameter (or transverse dimension) of the holes to be formed. On one hand, the electrode will exhibit an electrode capacity (C) that advantageously is reduced with smaller diameters. Note that smaller diameter electrodes will decrease any inefficiency in collection of ionization charge. However, on the other hand, electrode resistance and maximum electric fields disadvantageously increase with electrodes formed in smaller diameter holes.

For a 300 $\mu$m long electrode, the capacity C is about 0.1 pF. The electrode (resistance)×(capacitance) or RC product is related to the least time required for pulses to leave the electrodes. RC is about 90 ps for N+ electrodes, and is about 225 ps for 10 $\mu$m diameter P+ electrodes. For some (but not all) detector structures, the magnitude of R may also play a role in the noise performance, depending upon sensitivity of the electronics to which the electrode is coupled. If especially low resistance electrodes were required, one could selectively deposit tungsten in the central core of the holes. However, such measures are not deemed necessary for pixel detectors using three-dimensional electrodes, as disclosed herein.

To a first approximation, the initial signal developed on the electrodes due to released charge (g), $q/C_{electrode}$, is independent of wafer thickness (L) for penetrating ionizing particles, as electrode capacitance $C_{electrode}$ is approximately proportional to the thickness. In later stages of some electronic readout systems thinner wafers may produce smaller signals. However, any degradation of signal-to-noise ratio will be less rapid using detectors with three-dimensional electrodes, than would be the case for prior art planar two-dimensional electrode structures, as shorter electrodes have lower capacitance. If thinner substrate detectors are deemed desirable, perhaps due to multiple Coulomb scattering considerations, it is like that fabrication equipment and wafer handling considerations will set the lower limit on substrate thickness. However, thinner wafers should actually permit smaller hole diameters to be fabricated, resulting in a decrease in $C_{electrode}$.

Having decided upon suitable dimensions, the holes for the electrodes are formed preferably using deep reactive-ion etching ("RIE"), a process that can provide holes having depth-to-width ratios of 15:1 or greater.

In practice, etch-formed holes having a diameter of 15 $\mu$m and a length of 200 $\mu$m, with a top-to-bottom taper in the resultant hole-column of less than about 0.1 $\mu$m are readily fabricated. Holes of 10 $\mu$m in diameter have been etched, and as fabrication equipment and techniques continue to improve, smaller diameter holes should also be realizable. This advantageously implies small capacitance associated with the smaller diameter electrodes.

The columnar holes into or through the substrate are then made conductive, to form collection electrodes, according to the present invention. For silicon substrate-based detectors, the column-like holes are preferably filled with silicon, for example as the result of a surface recombination with a silane gas. Using a silane process is advantageous because the silane rebounds (or "bounces") off the silicon hole-wall surfaces many times before reacting, ensuring good silicon deposition throughout the length of the column-like holes.

Dopant gases preferably exhibiting similar behavior can be added to the silane as the holes are filled. For example, diborane and phosphine, when added to the silane, allow the fabrication of P+ and N+ electrodes respectively, e.g., P+ electrode 210 and N+ electrodes 220 in FIG. 2B. Silane, diborane, and phosphine each advantageously yield conformal coatings without tending to close or clog the hole opening before covering the hole-column bottom region. In practice, silicon layers deposited simultaneously on the wafer surfaces will have a thickness somewhat greater than the hole radius, and can be readily removed by etching.

In addition to experimenting to determine a smallest etch-formed hole size realizable with the equipment at hand, applicant investigated possible hole-filling electrode materials. Investigations were undertaken to determine whether the hole should be filled with single-crystal silicon (epitaxial, or "epi"), or whether polycrystalline silicon (polysilicon) could be used as fill material to form electrodes.

Epitaxial material is generally more difficult to fabricate than polysilicon, but nonetheless ia may be possible to use epitaxial to fill clean electrode holes that were undamaged during etching, since the interior hole surfaces are single crystal silicon. An epitaxial fill material could advantageously be combined with a gradually increasing dopant level during deposition. Following annealing, a radial dopant gradient results, providing a radial built-in electric field. (Even with uniform doping, a dopant gradient will be present even after annealing, but the gradient will be smaller.) This field will transport ionization charges in the same direction as the applied field, providing rapid charge collection from the entire volume of the detector, including the electrodes.

Following a fill deposition, the silicon is heated so the dopant atoms move to lattice sites and become electrically active. The dopant atoms also diffuse out from the N+ electrodes into the P substrate bulk and form P-N junctions in high-quality silicon. By contrast, using polysilicon fill material, diffusion of dopant atoms follows grain boundaries and is far faster than in single crystal silicon. Thus, for polysilicon fill electrode material, a nearly uniform doping density is established in the electrode. Unfortunately, such uniformity reduces the magnitude of the built-in field in the electrodes. Diffusion of ionization charge from the track to the start of an applied field several microns away, possibly with a small boost from Coulomb repulsion from the remainder of the track, appears necessary for collection. (Further details as to charge collection are provided later herein.) Recombination within the electrodes may not be a problem, as measurements made using 20 $\Omega$-cm epi in a charge-coupled device ("CCD") vertex detector show diffusion lengths of about 200 $\mu$m.

Once electrodes, e.g., 210, 220, have been formed, fabrication steps can be varied to produce monolithic pixel (or diode) detectors, bump-bonded pixel detectors, and strip detectors, with or without on-chip driving electronics associated with the bulk electrodes.

Although silicon is a most commonly used material for substrate 180, GaAs may be an even better candidate material. In general, larger substrate thicknesses provide good X-ray and gamma-ray detection efficiencies, but overly large thickness can introduce drift-length limitations. But the present invention may advantageously provide electrode spacings that are less than those drift length limitations, thus providing short maximum drift distances.

If the substrate material is GaAs, a material providing high electron mobility, the resultant detector 170 will provide very fast, probably sub-nanosecond, response times. Substrate-thick column-holes may be etched in GaAs and filled using metal organic chemical vapor deposition, for example with trimethyl gallium and arsine. A GaAs detector would circumvent limitations on maximum drift distances associated with a silicon substrate, and contribute to an efficient X-ray detector. Because of the low depletion voltages associated with GaAs, one could maintain the electric field near magnitudes that give high drift velocities, to achieve sub-nanosecond collection times. Such a GaAs detector, if combined with pixel readout parallel processing could handle very high rates indeed.

Figure 3B:
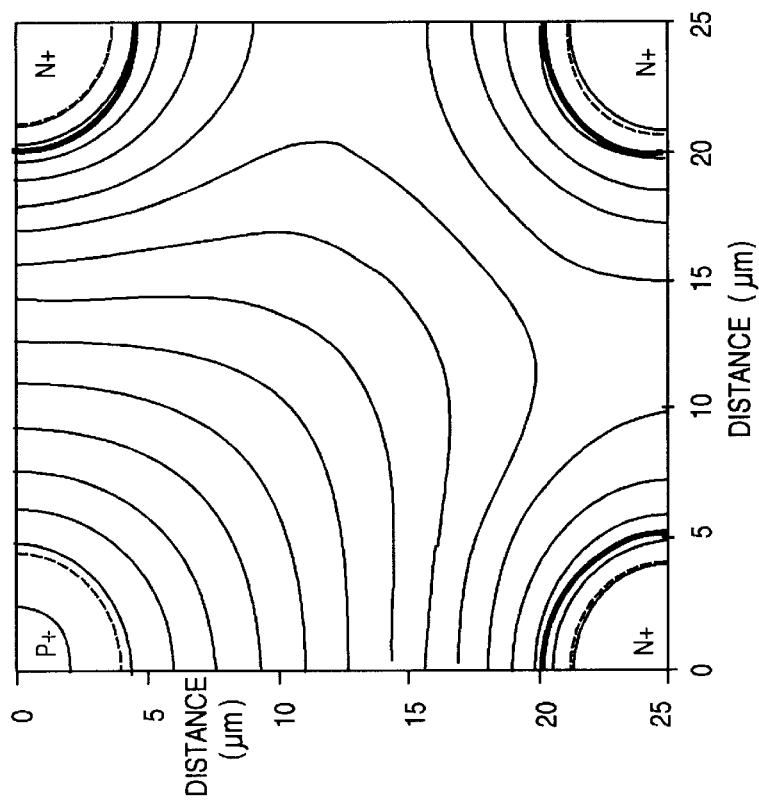
FIGS. 3A–3D depict equipotentials for one-quarter of the unit cell of FIG. 2B for different dopant concentrations and applied potential, according to the present invention.
Figure 3A:
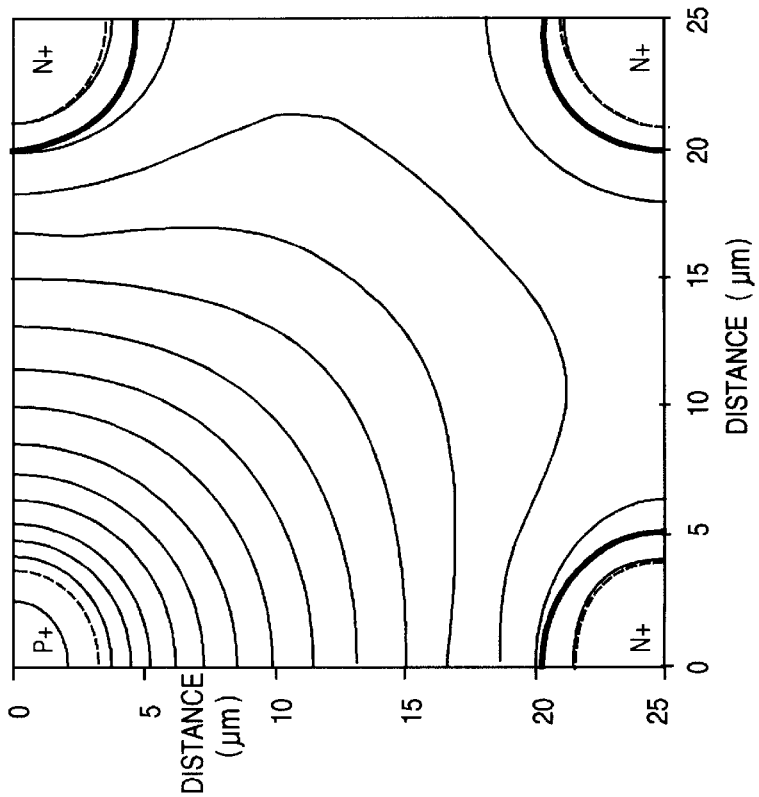

FIG. 3A depicts equipotentials for one-quarter of the unit cell 200 shown in FIG. 2B, with $10^{12}$ substrate dopant atoms per cm$^3$, and 5 V applied between the two metal electrodes. It is understood that what is shown in FIG. 31 (and other quarter-cell depictions herein) is a portion of cell 170 centered on P+ electrode 210, and showing portions of N+ electrodes 220, 22, 224. In FIGS. 3A–3D, a solid heavy line depicts the N-P junctions, and a dashed line is used to depict the boundaries of the depleted region. The cylindrical electrode doping profile assumed for the configuration of FIG. 3A and indeed throughout this application is:

$$10^{18} \cdot e^{-(r/r_o)^2}$$

where $r_o$ is elected to bring the dopant concentration to $10^{12}/cc$ at a distance $r=5$ μm. This profile produces N+ electrodes having a resistance of about 3 Ω/μm, and P+ electrodes with a resistance of about 7.5 Ω/μm.

Figure 3D:
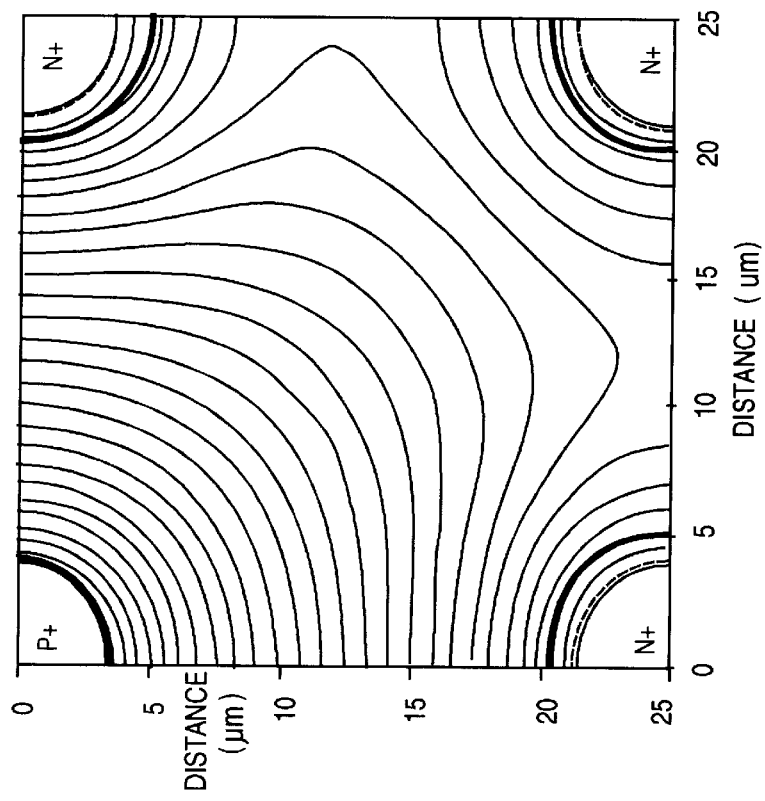
Figure 3C:
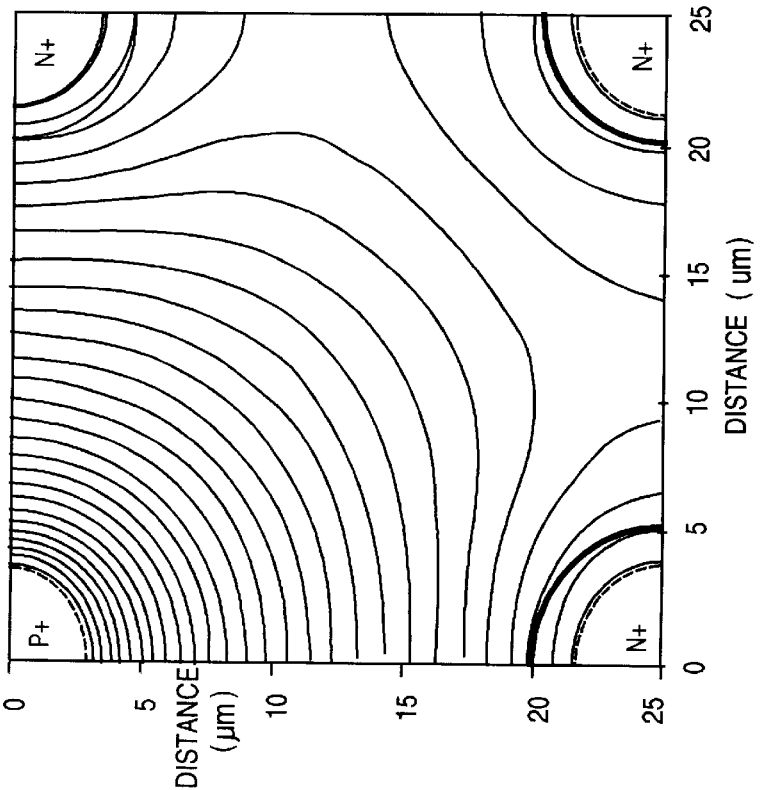

FIG. 3B is similar to FIG. 3A except that the substrate dopant concentration is raised to $10^{13}/cc$. In FIG. 3C, dopant concentration is again $10^{12}/cc$ but the inter-electrode potential is raised to 10 V. FIG. 3D is similar to FIG. 3C except dopant concentration is raised to $10^{13}/cc$. The effects of surface charges are not included in FIGS. 3A–3D. FIGS. 3A–3D do depict the absence of cylindrical symmetry in the fields and depletion depths into the electrodes. The lack of such symmetry is especially apparent for N+ electrodes 220, 224, which are adjacent to P+ electrode 210. Also apparent is the decrease in low-field volume for the heavier substrate doping cases shown in FIGS. 3B and 3D.

Figure 4:
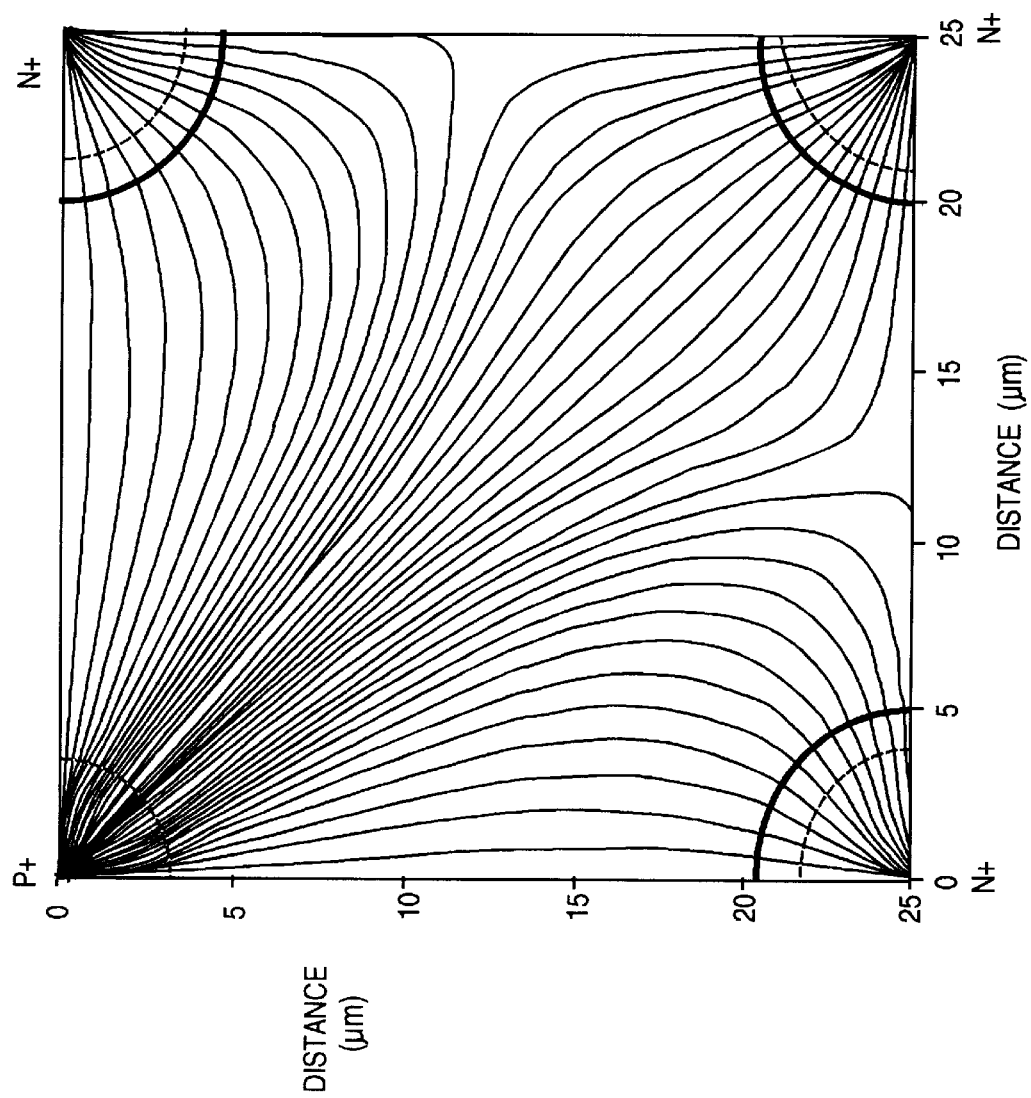
FIG. 4 depicts drift lines for a quarter-cell configuration for 5 V potential and $10^{12}$ dopant atoms/cc, according to the present invention.

FIG. 4 depicts the drift lines present in a quarter-cell for the case of $10^{12}/cc$ dopant concentration and 5 V potential. Again, a heavy line denotes the N-P junctions, while a dashed line depicts the boundaries of the depletion region.

Figures 5A, 5B:
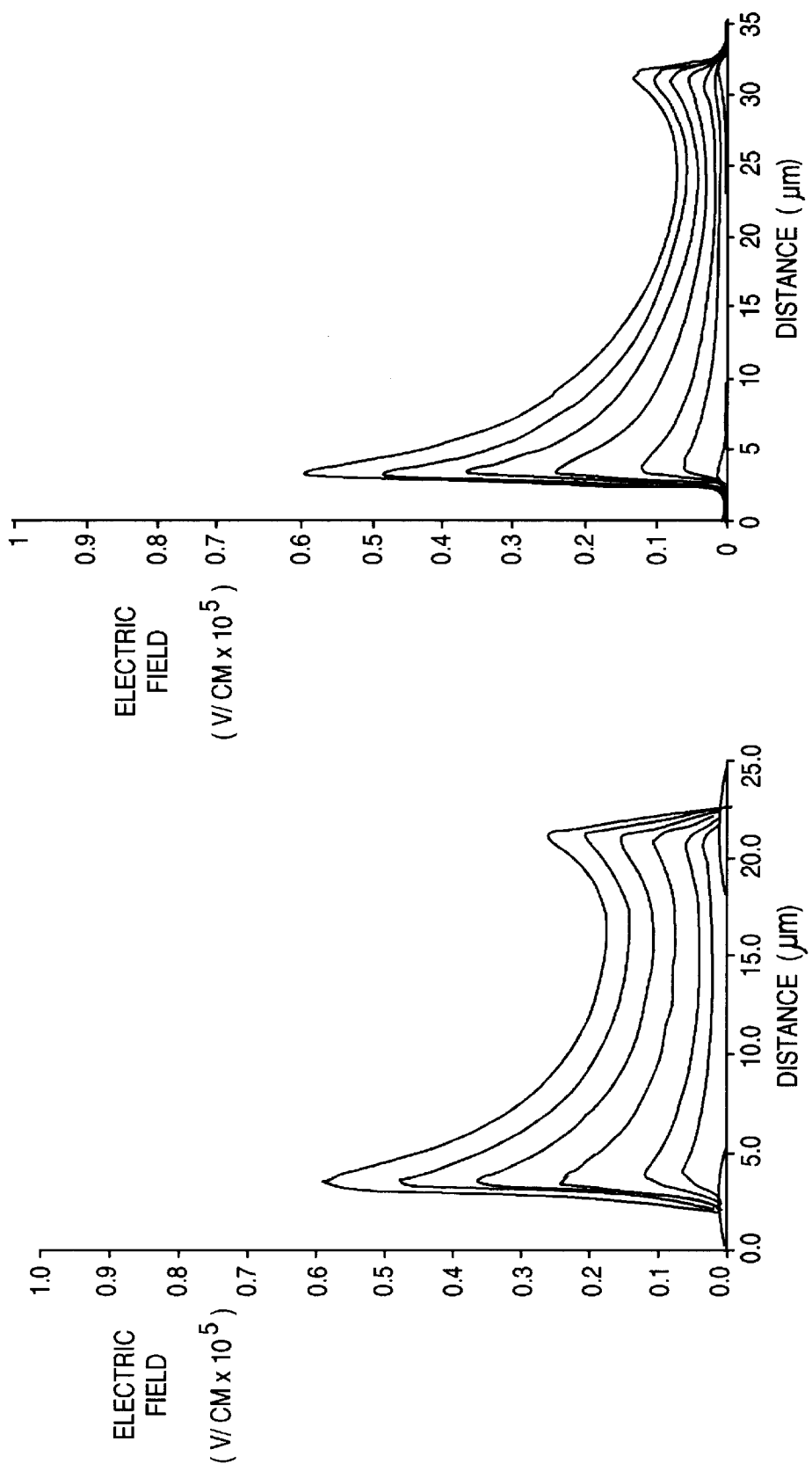
Figures 5C, 5D:
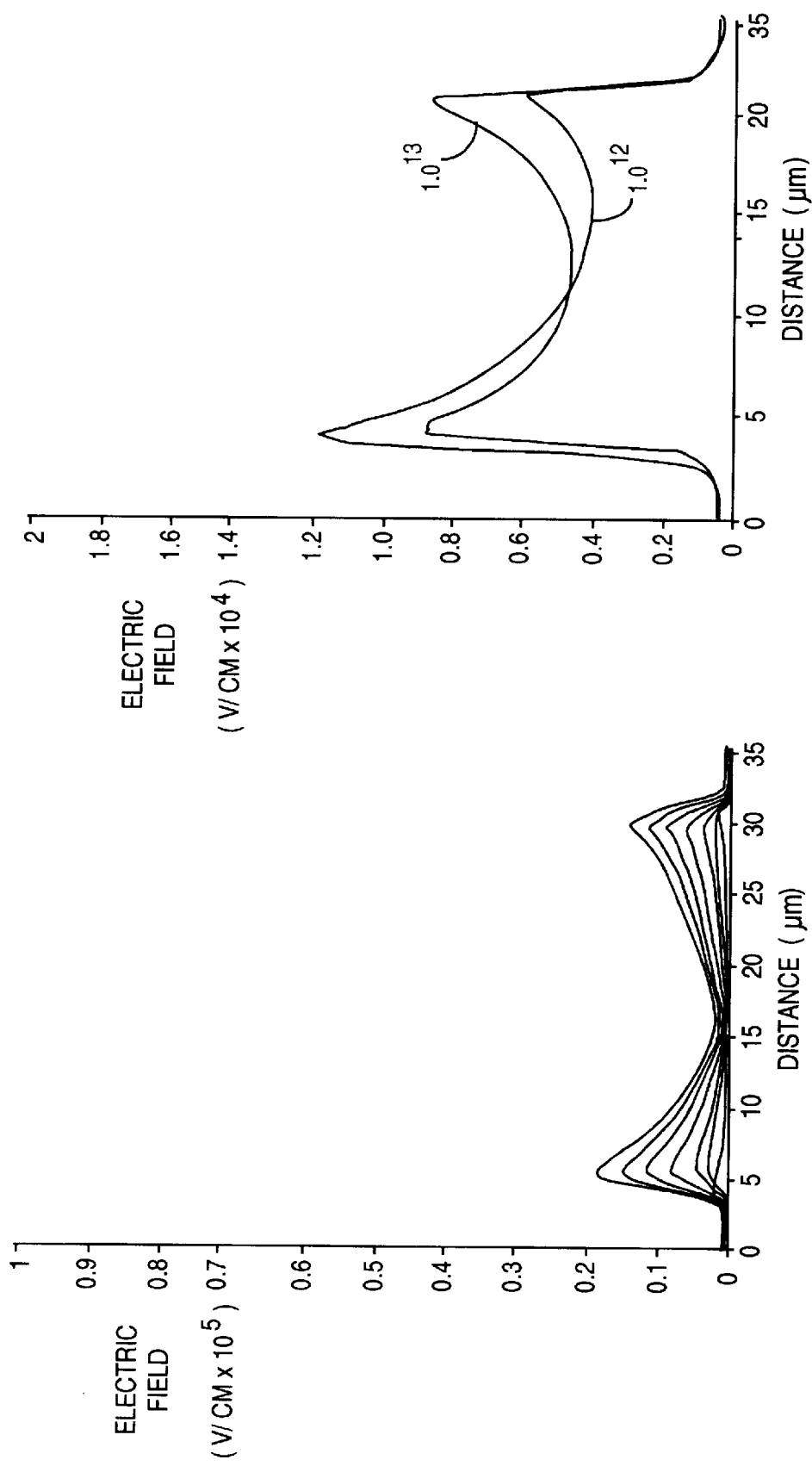
FIG. 5D is a comparison of electric field magnitudes for a quarter-cell configuration for different substrate dopant concentrations, according to the present invention.

FIG. 5A depicts electric field magnitudes for a quarter-cell along lines from the P+ electrode 210 to an adjacent N+ electrode, electrodes 220 or 224, for a doping concentration of $10^{12}$ dopant/atoms per cc. The electric field magnitudes represent applied voltages of 50 V (uppermost trace), 40 V, 30 V, 20 V, 10 V, 5 V, and 0 V (bottommost trace). FIG. 5B is a similar representation except the electric field magnitudes are along a line from P+ electrode 210 to diagonal N+ electrode 222. In FIG. 5C, the electric field magnitudes are along a line from an N+ electrode to an adjacent N+ electrode, e.g., from electrode 222 to 220, or electrode 222 to 224. In FIGS. 5A–5C, 5V (the next-to-bottom trace) is more than sufficient potential to produce full depletion. Especially advantageously, peak electric fields are more than an order of magnitude below typically 100,000 V/cm avalanche field strengths.

FIG. 5D compares electric field magnitudes for a quarter-cell measured along a line from P+ electrode 210 to adjacent N+ electrode 220 or 224, e.g., for the case shown in FIG. 5A. In FIG. 5D, 10 V potential was used, and the two curves represent substrate dopant concentrations of $10^{12}/cc$ and $10^{13}/cc$. Note that the peak electric fields actually decrease as substrate doping increases by a factor of 10. The higher substrate dopant level is somewhat analogous to what may occur with radiation damage. Peak fields, located where the depletion volume meets the electrodes, decrease due to the increase in voltage dropped across the substrate, which is lightly doped compared to the electrodes. The small but non-zero values of the electric fields at the ends of the plot (corresponding to the electrode centers) are due to approximations in the finite element calculations used for the data plotted in FIG. 5D.

Figure 6:
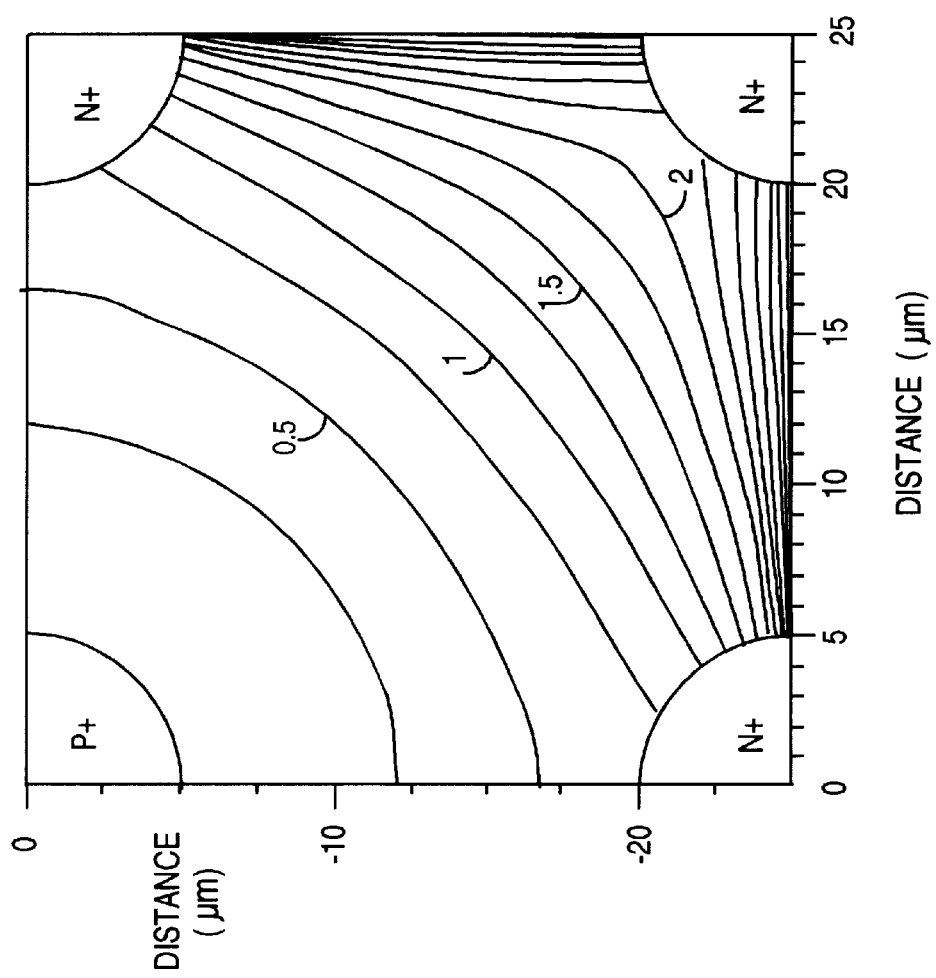

FIG. 6 depicts lines of equal drift time for potential distributions for a quarter-cell in which substrate dopant concentration is $10^{12}/cc$ and applied potential is 10 V. Zero time is measured from the P+ electrode (shown in upper left corner of FIG. 6) at a radius $r=5$ μm, and charges are traced backwards. Due to the role played by diffusion, data lines in the immediate vicinity of the zero-field points near the bottom center, and right center in FIG. 6 are not reliable. Further, relatively few tracks are traced backwards to these zero-field regions.

However, FIG. 6 demonstrates that drift time from cell center is less than 1 ns, and that drift times from the other electrodes range from 1 ns to 4 ns. The drift time from the far cell borders is infinity because in those regions the collection field goes to zero. Thus, to obtain realistic drift times for tracks in those regions, one should add diffusion, and for ionization created near or inside electrodes, one should provide the built-in fields. The calculations depicted were carried out using MEDICI.

Figure 7B:
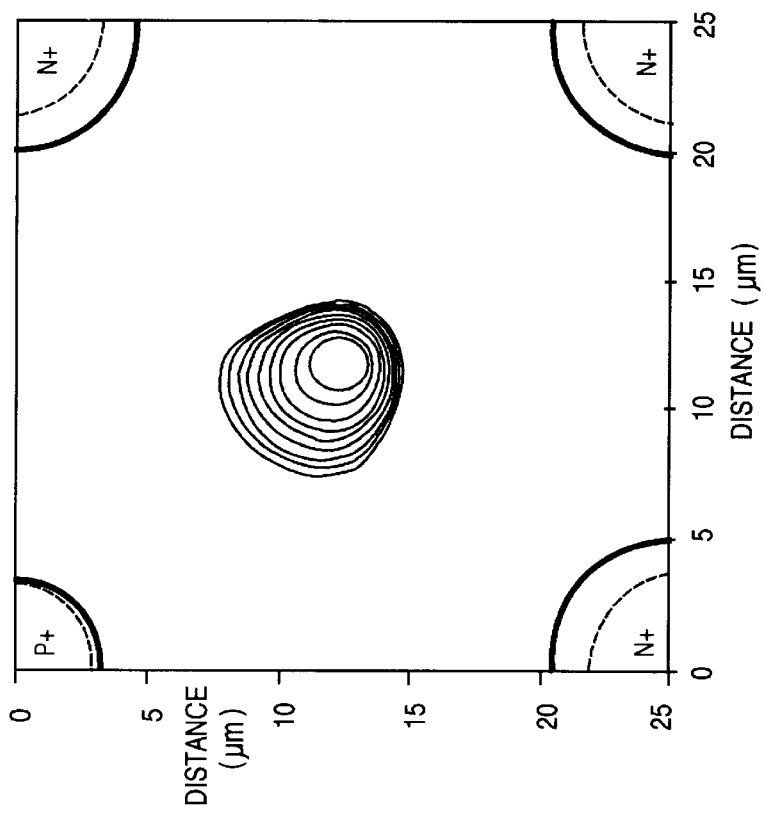
Figure 7A:
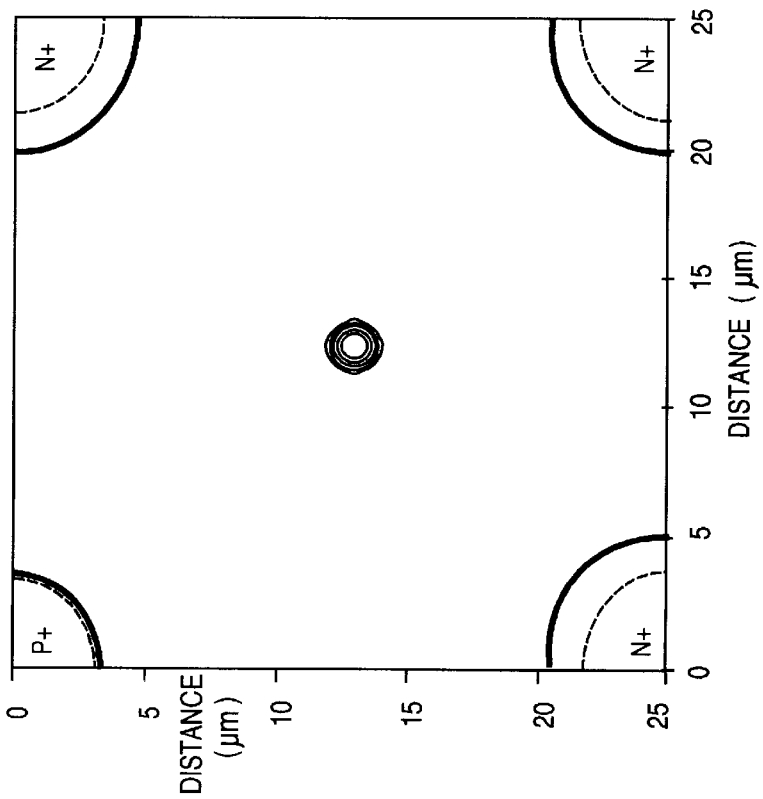

FIG. 7A represents charge density contours (two contours per decade) for electron-hole pairs, for a quarter-cell having 10 V potential, $10^{12}/cc$ dopant concentration, for holes starting from the cell center at 0.1 ps. The contours in FIGS. 7A–7L were obtained by starting with an ionization track of 24,000 electron-hole pairs parallel to the electrodes in a quarter-cell such as shown in FIG. 2B. In FIGS. 7A–7E, the ionization tracks were parallel to the electrodes and went through the middle of the cell, which results should be typical of much of the area. In FIGS. 7F–7L, the tracks were through the null point on the border between two cells, which should represent the slowest case.

Figure 7F:
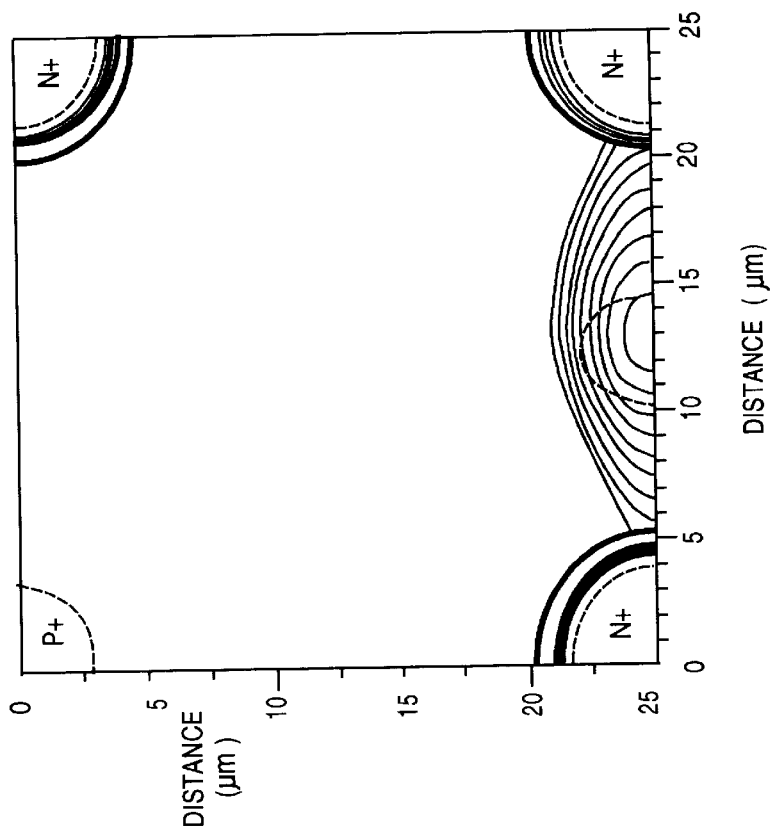
Figure 7E:
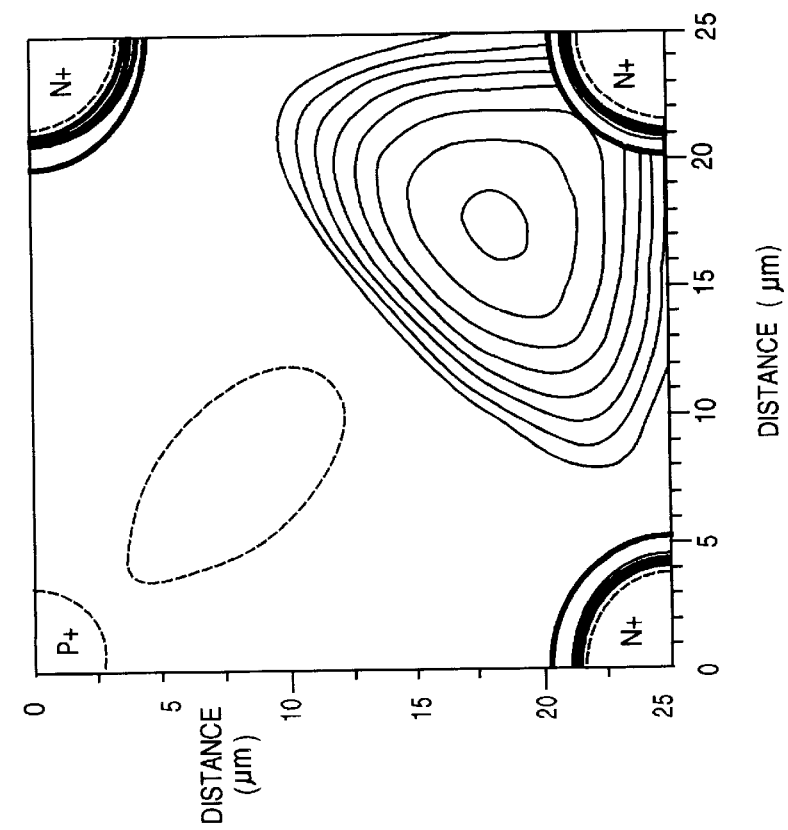
Figure 7H:
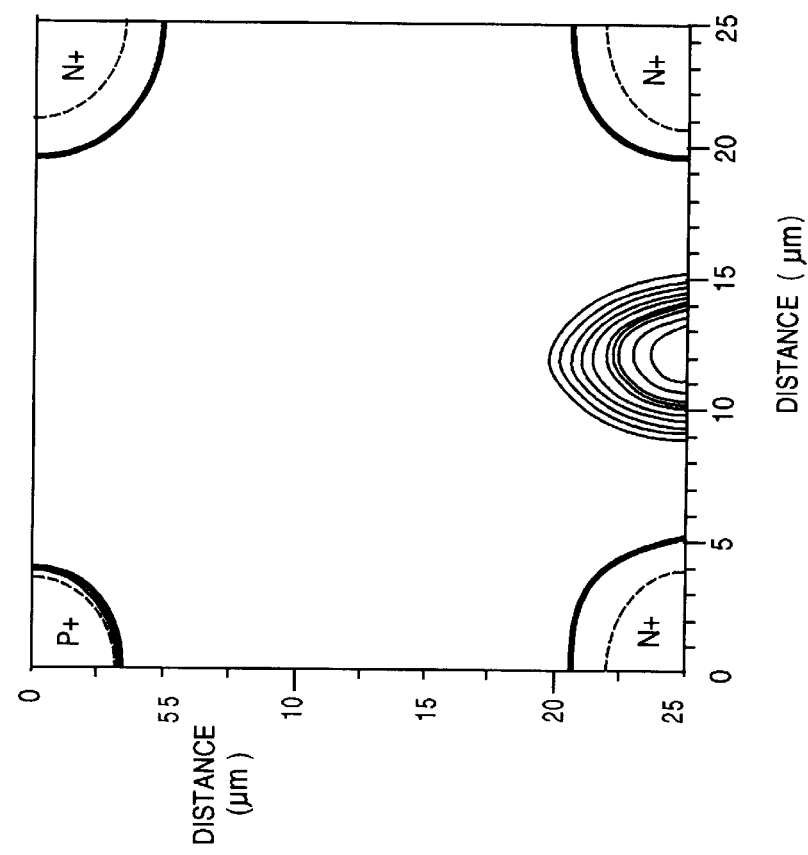
Figure 7G:
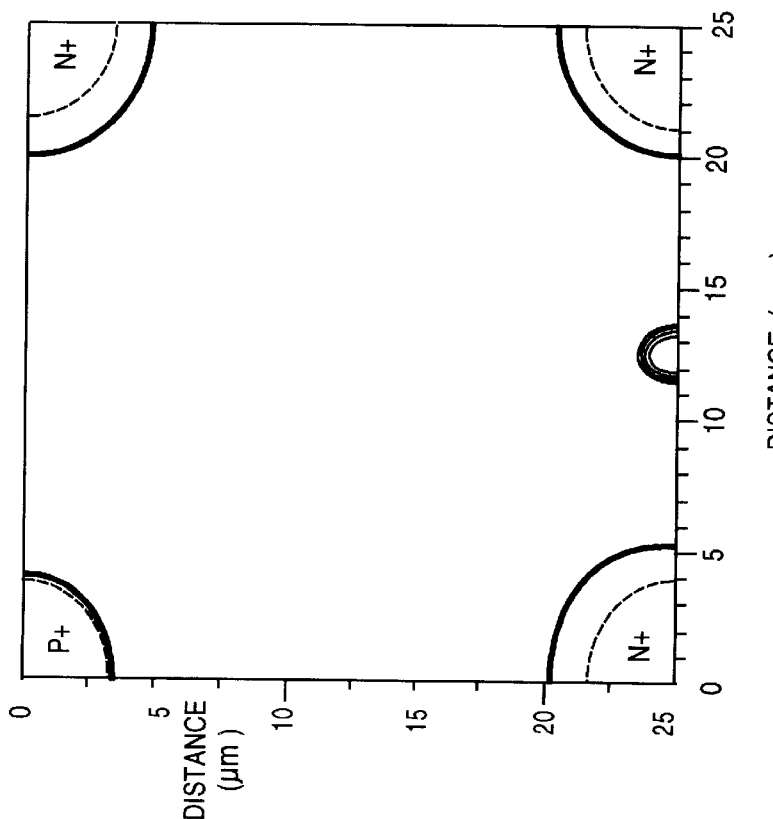
Figure 7J:
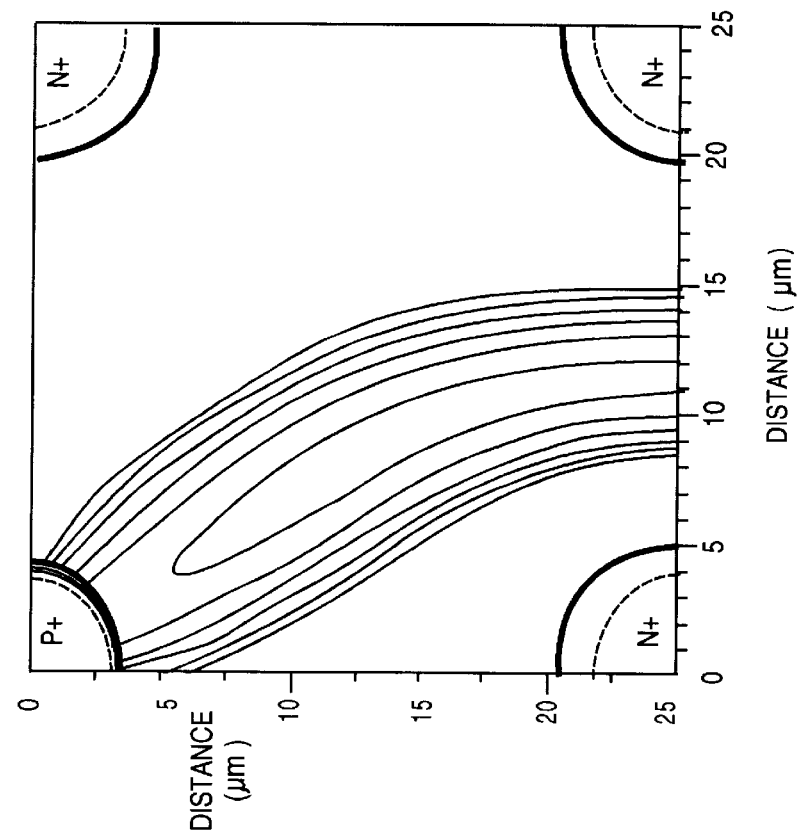
Figure 7I:
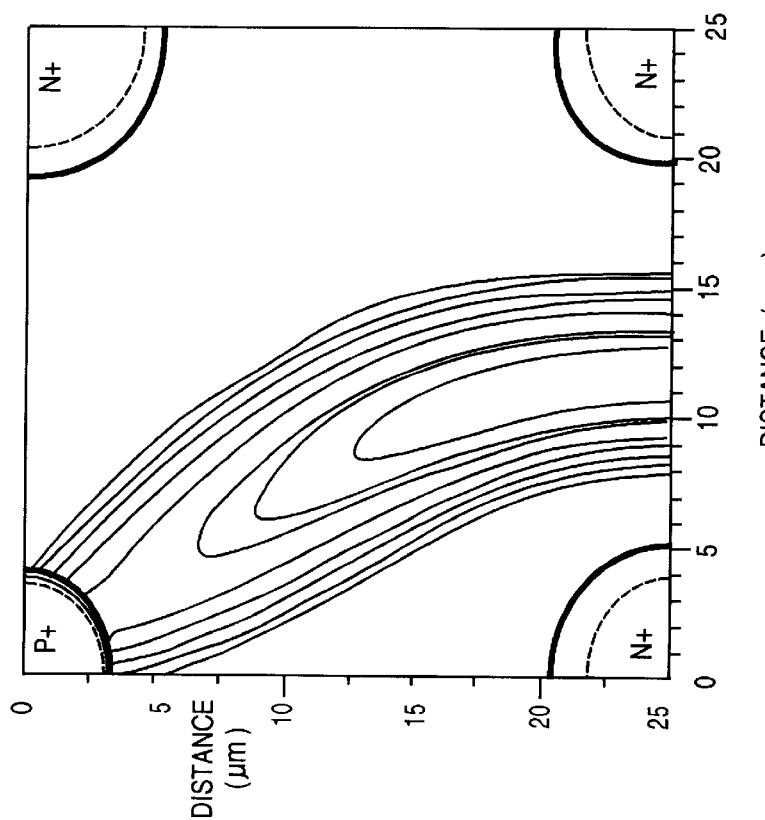
Figure 7K:
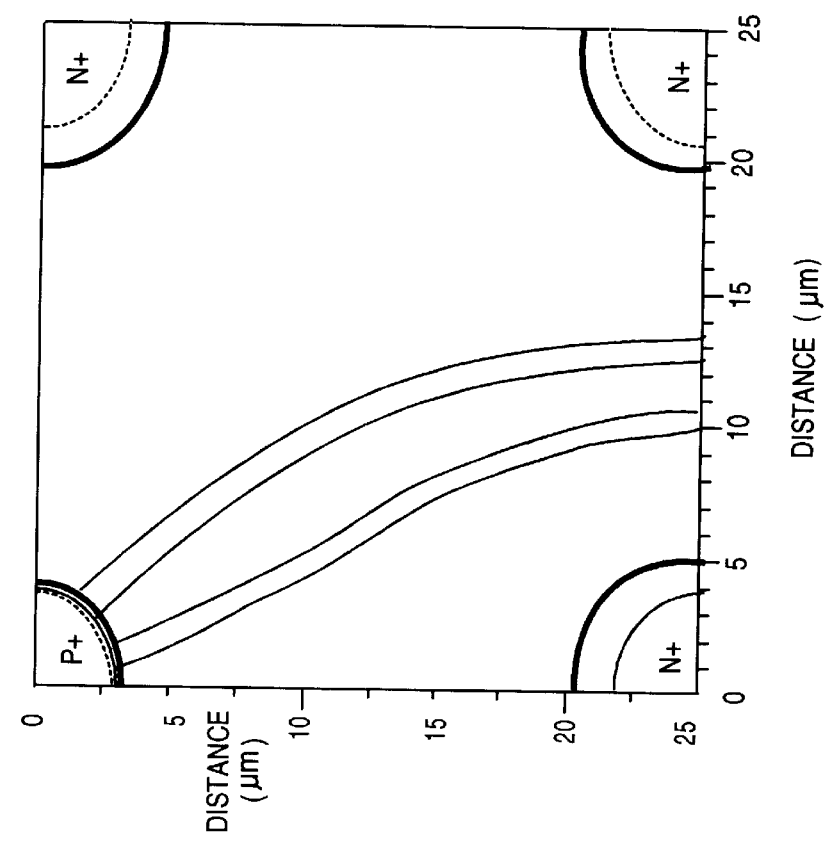
Figure 7L:
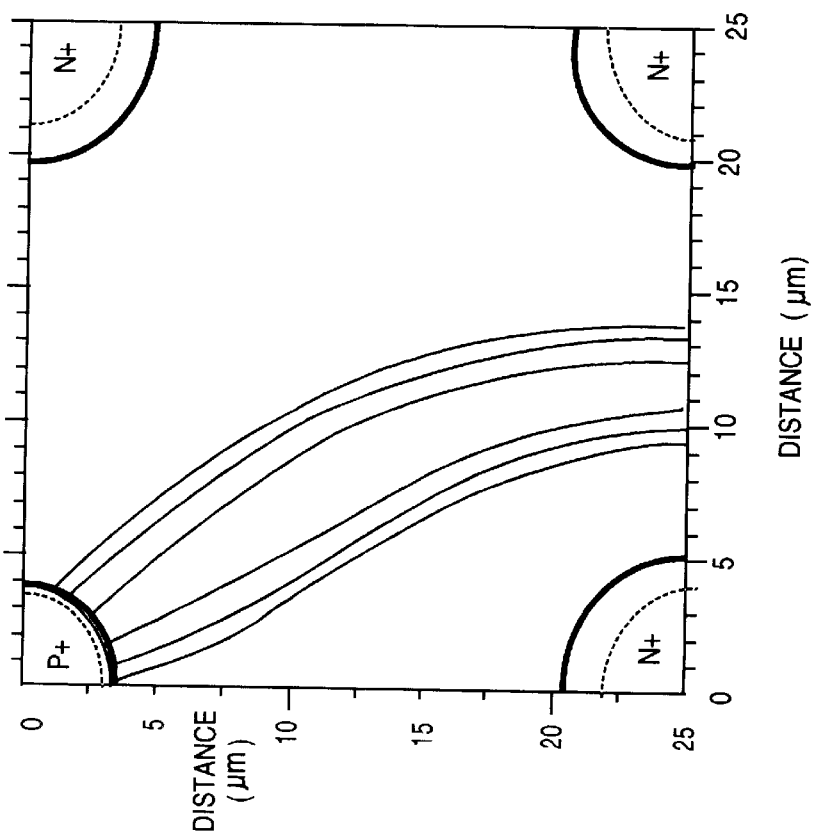

FIGS. 7B, and 7C are similar to FIG. 7A except that holes starting from the center are shown at 89 ps and 432 ps, respectively. In FIGS. 7D and 7E, electrons starting from the cell center are shown at 89 ps and 432 ps, respectively, again for 10 V potential and $10^{12}/cc$ dopant concentration. FIG. 7F is similar except that electrons starting from the null point are shown at 175 ps. In FIGS. 7G–7L, charge density contours are shown at 0.1 ps, 175 ps, 1.7 ns, 3 ns, 4 ns, and 5 ns, respectively again or 10 V potential and $10^{12}/cc$ dopant concentration, for holes starting from the null point.

Figure 8B:
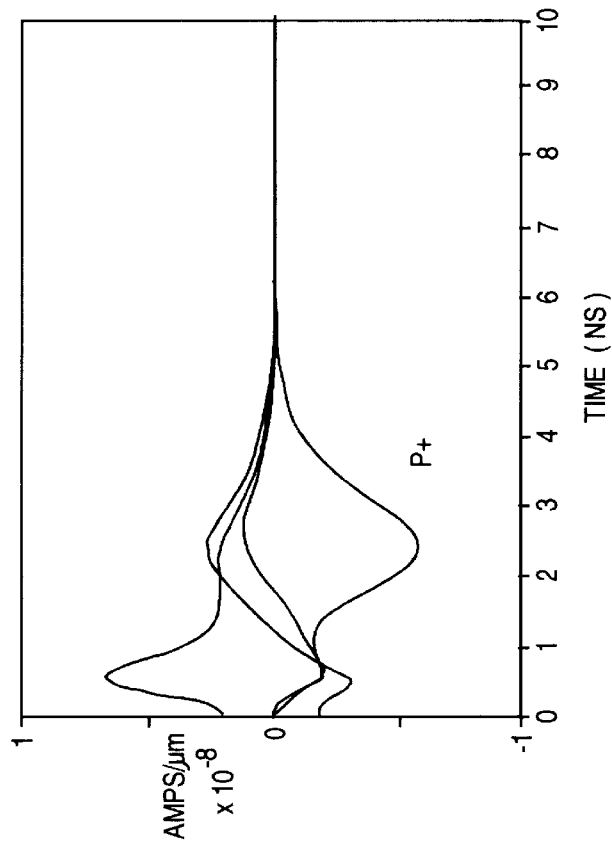
FIGS. 8A and 8B depict current pulses on collection electrodes from tracks parallel to the electrodes, according to the present invention.
Figure 8A:
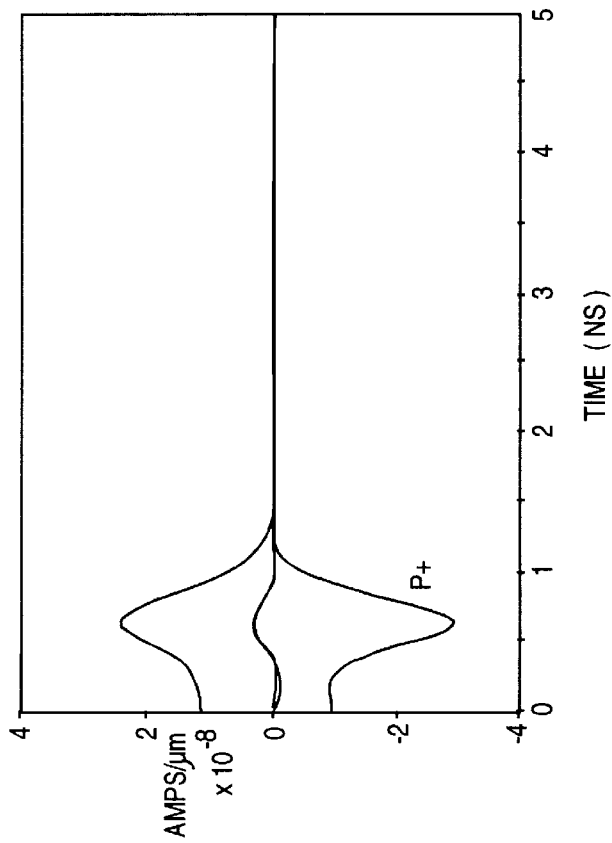

FIG. 8A shows current pulses seen on four collection electrodes (with the P+ electrode pulse specifically labelled) from a track that is parallel to the electrodes and goes through the cell center. FIG. 8B is similar but shows a track going through the null point between two N+ electrodes. FIGS. 8A and 8B include the effects of induced pulses from moving charges and diffusion, but do not include Landau fluctuations or Coulomb forces from the other charges along the track. In FIGS. 8A and 8B, a 10 V potential was used, and dopant concentration was $10^{13}/cc$.

The small difference in FIG. 8A (the midpoint start) between pulses on the two N+ electrodes adjacent the P+ electrode is due to small but non-zero grid effects. Note also that the effects of induced pulses from moving charges can be seen. In FIG. 8A, the current pulse signal peaks at 0.5 ns and returns to the base lines at 1.5 ns. This is in stark contrast to the perhaps 25 ns to 40 ns return-to-baseline time required for signals on strip detectors using prior art two-dimensional electrodes (such as shown in FIG. 1). The return-to-baseline time can be important for pile-up considerations, especially since Landau fluctuation effects can be present until all the charge is collected. In FIG. 8B, the current signal pulse on the P+ electrode for the null point track peaks at 2.4 ns, and returns to the baseline at about 6 ns.

It is to be appreciated although the response times reflected in FIGS. 8A and 8B are significantly shorter than typical times for detectors using two-dimensional planar electrodes, these shorter times are obtained with three-dimensional devices having far lower maximum fields. Thus better performance is attainable from devices operated at safer device electric field levels.

The various results thus far described pertain to charge motion in the substrate bulk of a detector having three-dimensional electrodes. However, close to the upper and lower surfaces of such a detector, consideration must be given to the effects of surface charges and indeed of the structure itself.

FIGS. 9A–9F depict calculated equipotentials obtained from a simple two-dimensional model in which the N+ and P+ electrodes were flat slabs. The slab electrodes were separated by a 15 μm region of silicon having $10^{12}$ acceptors/cc and covered with an oxide layer having $10^{11}$ positive interface charges/cm². The electrodes were at 0 μm to 5 μm and 20 μm to 25 μm, and were doped throughout at $10^{18}$/cc. The charges were along the top surface, between the electrodes.

Figure 9B:
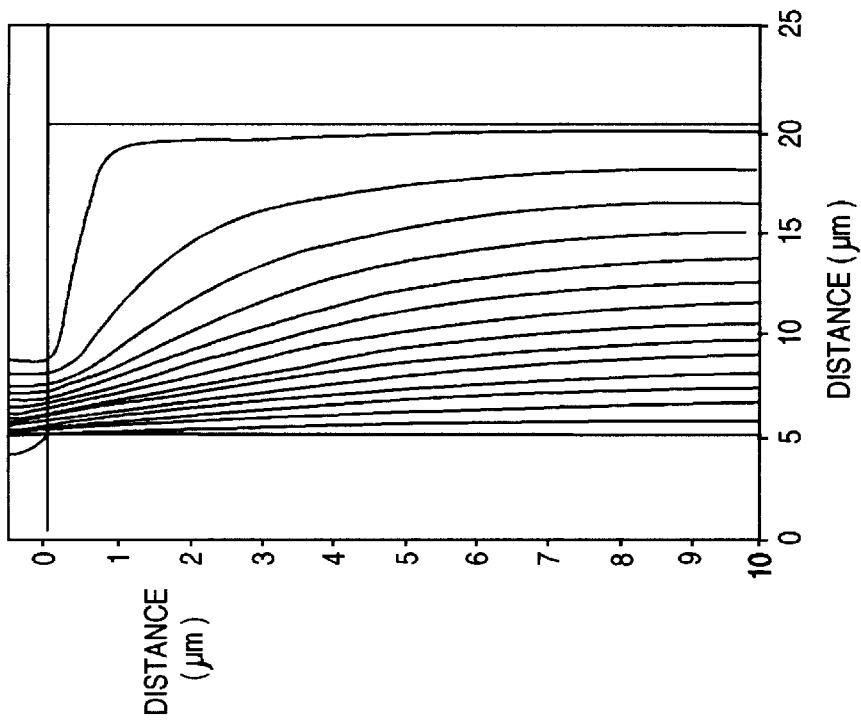
FIGS. 9A–9F depict oxide interface charge effects under varying conditions for a two-dimensional model.
Figure 9A:
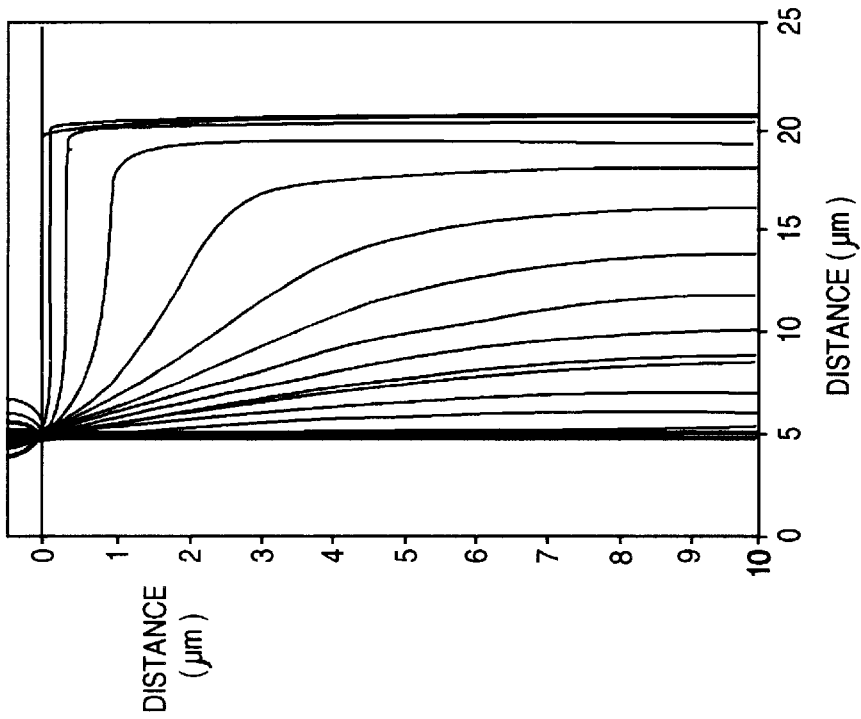
Figure 9D:
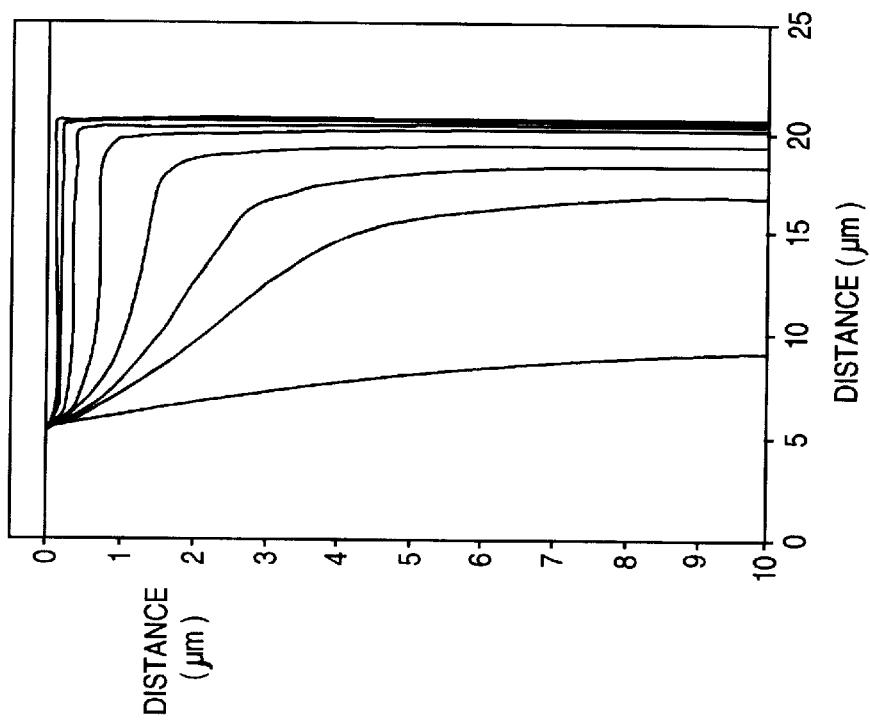
Figure 9C:
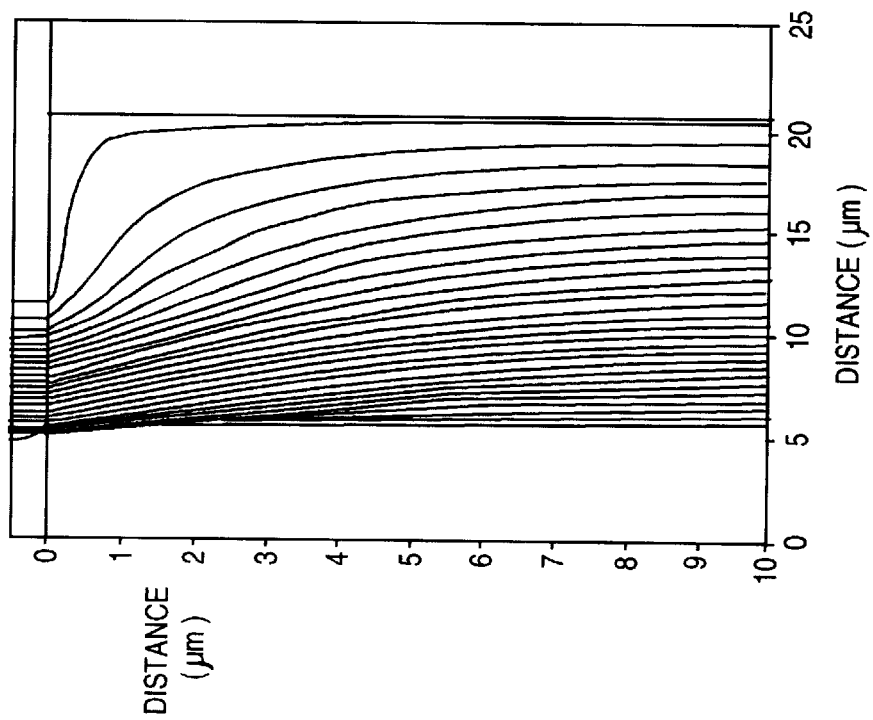
Figure 9F:
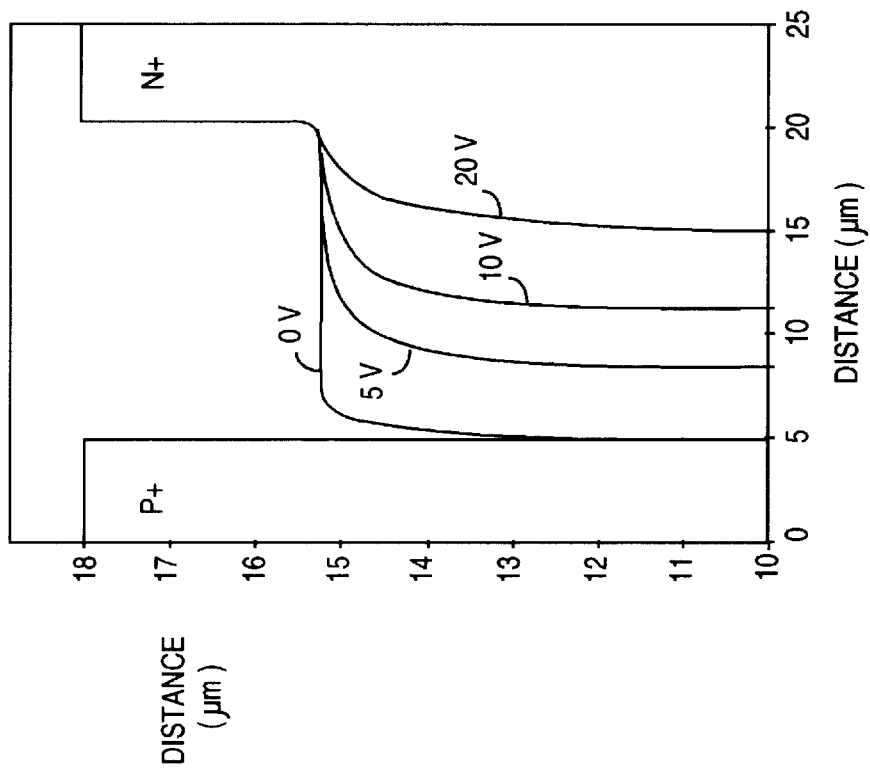
Figure 9E:
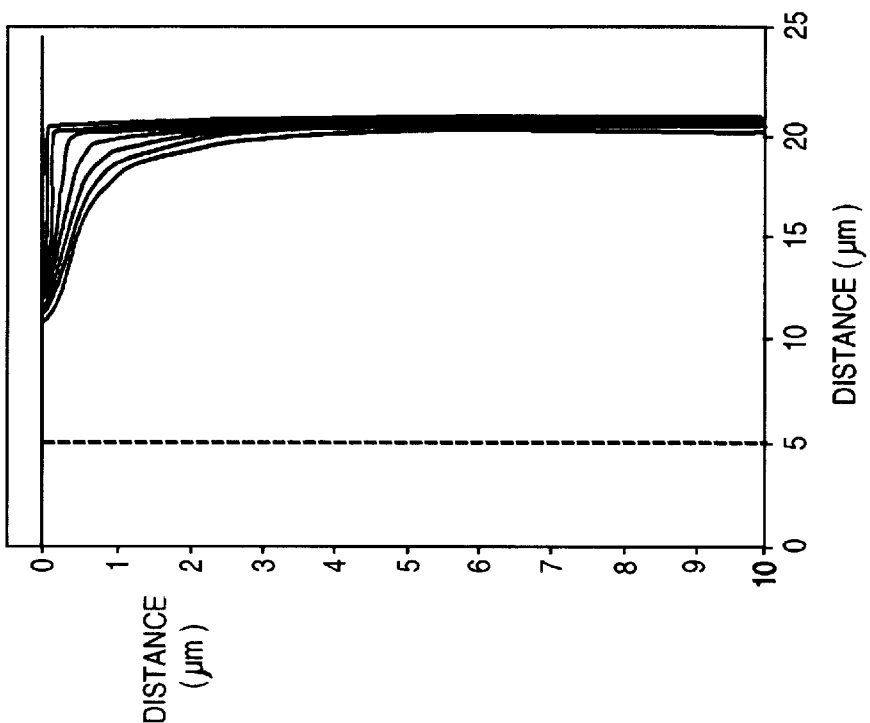

FIG. 9A depicts data for 0 V applied potential. Note the effect of negative charge induced by the oxide charge, as manifested by the closest equipotential line almost parallel to the surface. The contact of the induced charge with the N+ electrode to the right forces equipotentials from the built-in field into a bundle next to the P+ electrode. It follows that the capacitance between the two electrodes will be relatively high. FIG. 9B shows similar equipotentials for 5 V potential, whereas FIG. 9C shows equipotentials for 10 V potential. As the applied potential is increased from 0 V to 10 V, an increasingly wider depletion zone at the surface is apparent. FIGS. 9D and 9E depict electron density contours for 0 V and 10 V potential, respectively. FIG. 9F depicts net carrier concentration at 0.1 μm below the surface for 0 V, 5 V, 10 V and 20 V, with 10 V applied potential.

It is seen in FIGS. 9A–9F that a layer of induced electrons is present that nearly reaches the P+ electrode, and that application of a voltage bias to the electrodes causes a gap to appear. This result suggests that use of P+ guard rings around the top of P+ electrodes may not be needed in practice. However, such guard rings may be needed for radiation damaged oxides with larger surface charges.

Figure 10A:
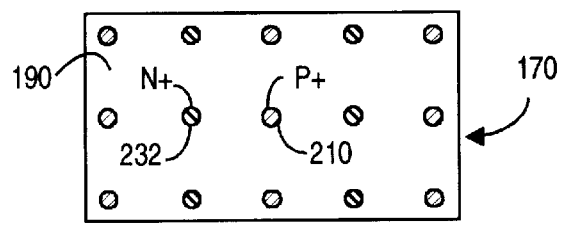
FIGS. 10A, 10B, 10C depict top views of various detector structures, according to the present invention.
Figure 10B:
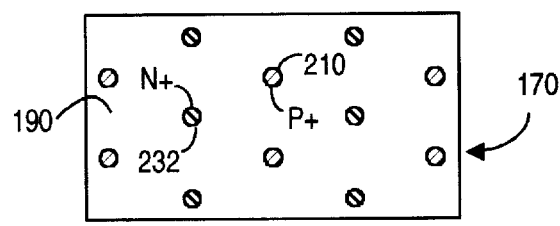
Figure 10C:
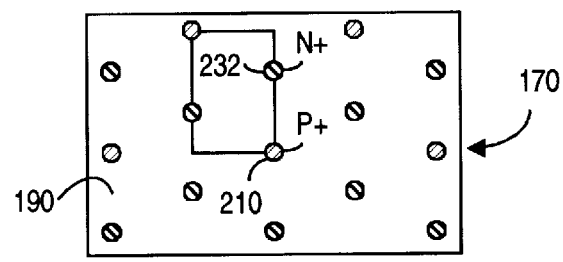

FIGS. 10A–10C depict top views, and FIGS. 10D–10H depict side views of alternative detector structures, according to the present invention. In FIG. 10A, for example, P+ electrodes and N+ electrodes are shown, which electrodes may extend (into the page) through the entire thickness of the surrounding substrate (as do electrodes 210, and 220, for example in FIG. 2B). Alternatively, some or all of these electrodes may extend but a fraction into the substrate. In the embodiment of FIG. 10A, in a plan view there are rows of N+ electrodes and rows of P+ electrodes, arranged in a regular grid-like array. By contrast, in FIG. 10B, there are again rows of P+ and N+ electrodes, but instead of a grid-like array, adjacent rows are staggered or offset from each other. In the hexagon-shaped cell configuration of FIG. 10C, rows are arranged to include repeating groups; of two adjacent electrodes of one dopant polarity, one electrode of the opposing dopant polarity.

Several possible detector structures are shown in FIGS. 10D–10H, in which only two electrodes are depicted for ease of illustration. In each of these figures, a portion of detector 170 is shown, in which detector 170 is fabricated on a substrate 180 that includes a P—depleted region 300 having an upper surface 190 and a lower surface 200. As seen from FIGS. 2A and 2B, the distance between surfaces 190 and 200 defines the substrate thickness L. In each of FIGS. 10D–10H, the P+ doped electrode is denoted 210, and the N+ electrode is denoted 240. Electrodes 210, 240 are shown with a somewhat exaggerated lateral extension at upper surface 190, the extensions pointing toward each other in these figures. It is believed that the extension surfaces can improve electrical contact to overlying metal connecting traces (not shown), especially in view of any uneven topography of the IC containing the various detectors.

In the configuration of FIG. 10D, an N-well 310 is implanted in a region of the upper substrate surface 190 between the two electrodes, and an N+ layer 320 is implanted in a region between the two electrodes on substrate lower surface 200. N+ layer 320 may advantageously be formed by driving phosphorus into single crystal silicon from a polysilicon layer, thereby providing gettering from both the phosphorus and polysilicon.

The configuration of FIG. 10E is somewhat different in that P+ rings 330, 340 are formed in the region between the two electrodes at the substrate upper and lower surfaces. Note that oxide layer regions 350, 360 separate and isolate the P+ rings from electrodes 210, 240. The configuration of FIG. 10E (as well as that of 10D) would require back side lithography for fabrication. This is not difficult, however, in that the structures are relatively crude and the hole-cylinders provide alignment marks.

In the configuration of FIG. 10F, oxide layers 350 and 360 are formed in the region between the two electrodes at the substrate upper and lower surfaces, respectively. The embodiment of FIG. 10G provides an N-well 310 at upper substrate surface 190 (as in FIG. 10D), and provides an oxide layer 360 on the lower substrate surface 200. Note that electrodes 210 and 240 are shown in FIG. 10G as having lengths less than the substrate thickness L. The embodiment of FIG. 10H replaces the oxide layer 360 in FIG. 10G with an N+ layer 370. Note too that the L1, L2, lengths of electrodes 210, 240 are shown as being unequal. It is understood that electrode lengths according to the present invention need not be equal to each other, or to substrate thickness L.

It will be appreciated that the shortened electrode lengths shown in FIGS. 10G and 10H permit implanting a (conducting) N+ layer (e.g., layer 370 in FIG. 10H) without requiring double-sided patterning. In general, for P-substrates, cells with N+ layers ar easier to deplete, and cells with P+ rings are more difficult to deplete. On the other hand, however, the N+ layer, forming an equipotential normally at the same voltage as the N electrodes will make regions with relatively slow drift velocities. (Upper surface wells in monolithic devices would also create such regions.) In practice, these slower drift velocity regions ought not to affect the main portion of a pulse from an ionizing particle, but could add somewhat to the tail portion of the pulse.

It is to be understood that in any or all of the configurations described herein, or fabricated according to the present invention, some or all of the electrodes may have a length L1 that is less than the substrate thickness L, and that the various electrode lengths need not be equal.

Figure 11:
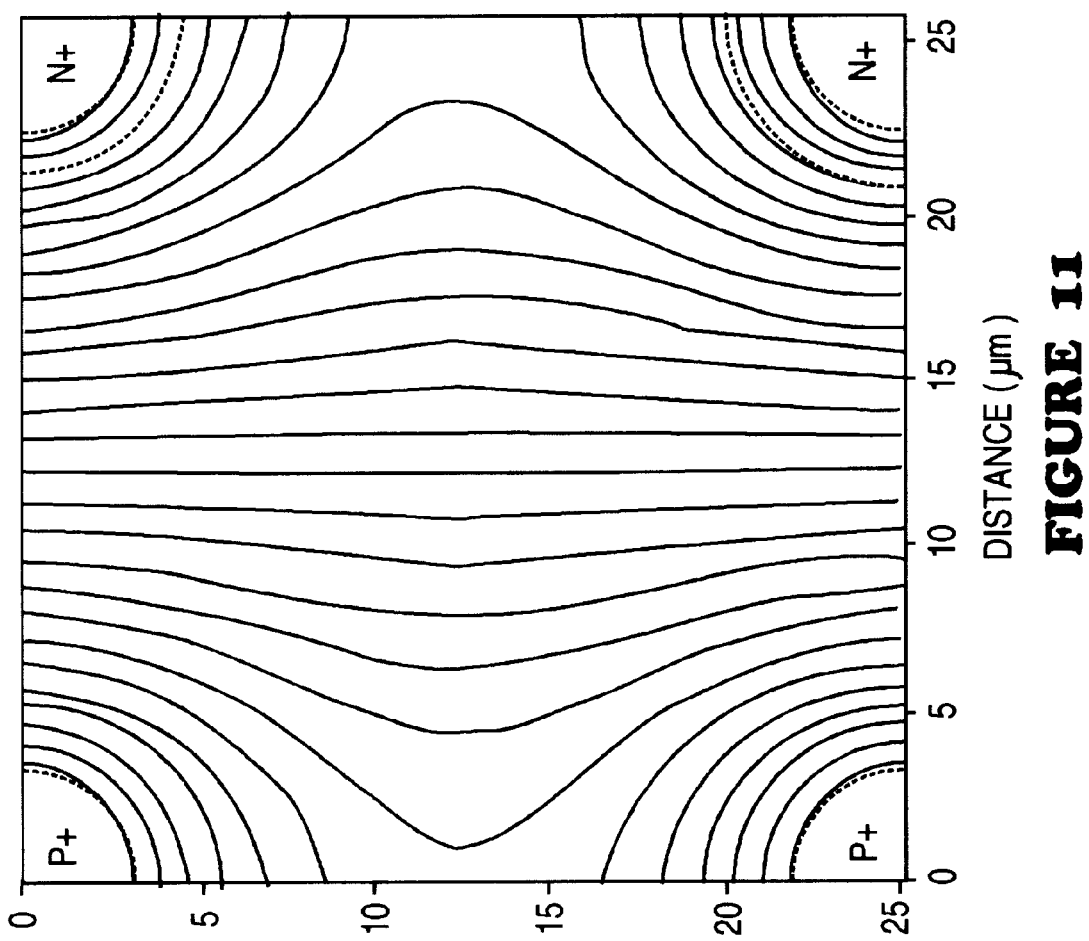
Figure 12A:
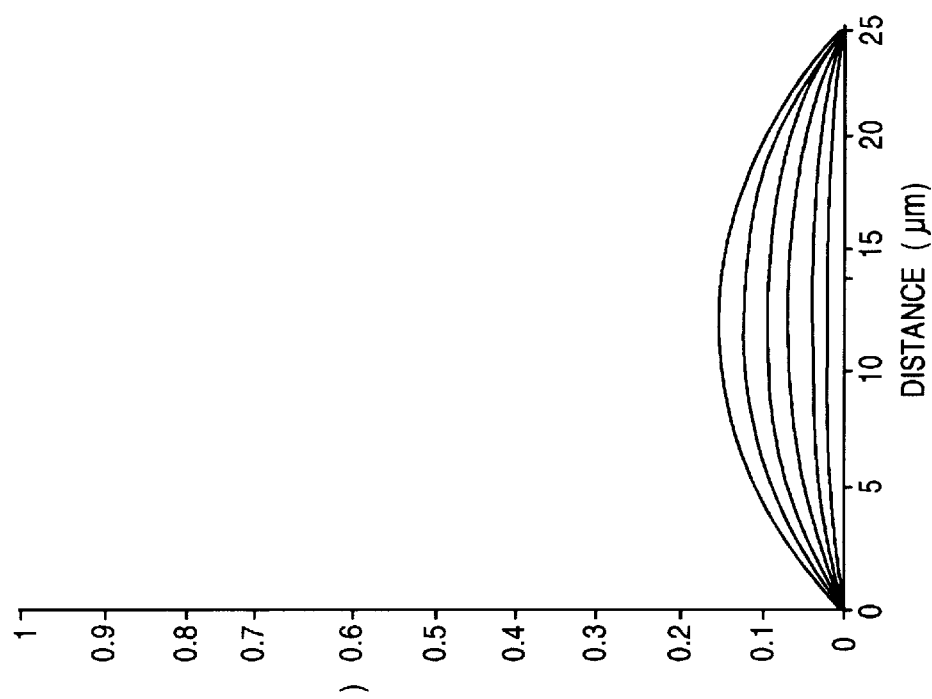
FIG. 12A depicts electric field magnitudes for the cell of FIG. 10A along a line connecting adjacent P+ and N+ electrodes, according to the present invention.
Figure 12B:
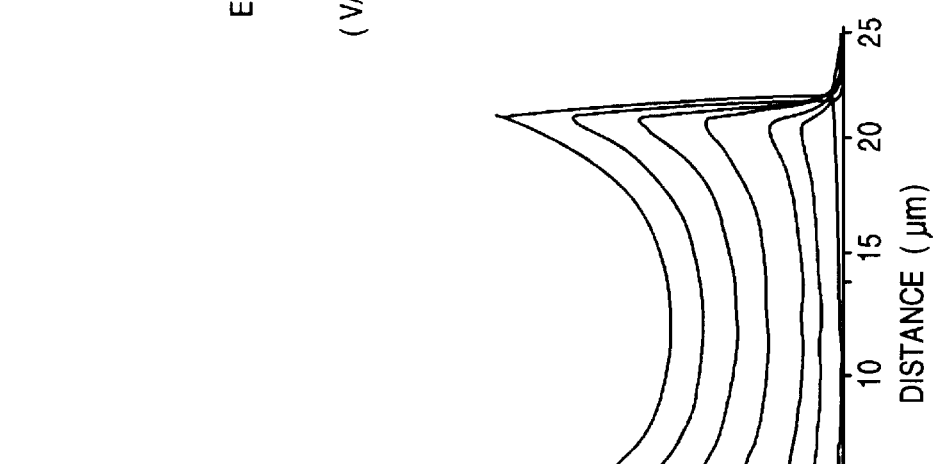
FIG. 12B depicts electric field magnitudes for the cell of FIG. 10A along a horizontal line through the middle of the equipotential graph of FIG. 11, according to the present invention.

FIG. 11 shows equipotentials for one cell of FIG. 10A, for $10^{12}$ net dopant atoms/cc, and 10 V applied bias. FIGS. 12A depicts electric field magnitudes for a cell such as shown in FIG. 10A along a line connecting an N+ electrode with a directly opposite (e.g., adjacent) P+ electrode. For the same cell, FIG. 12B depicts electric field potentials along a mid-point horizontal parallel line through cell middle. (The trace voltages are the same as shown in FIG. 5.)

Figure 13:
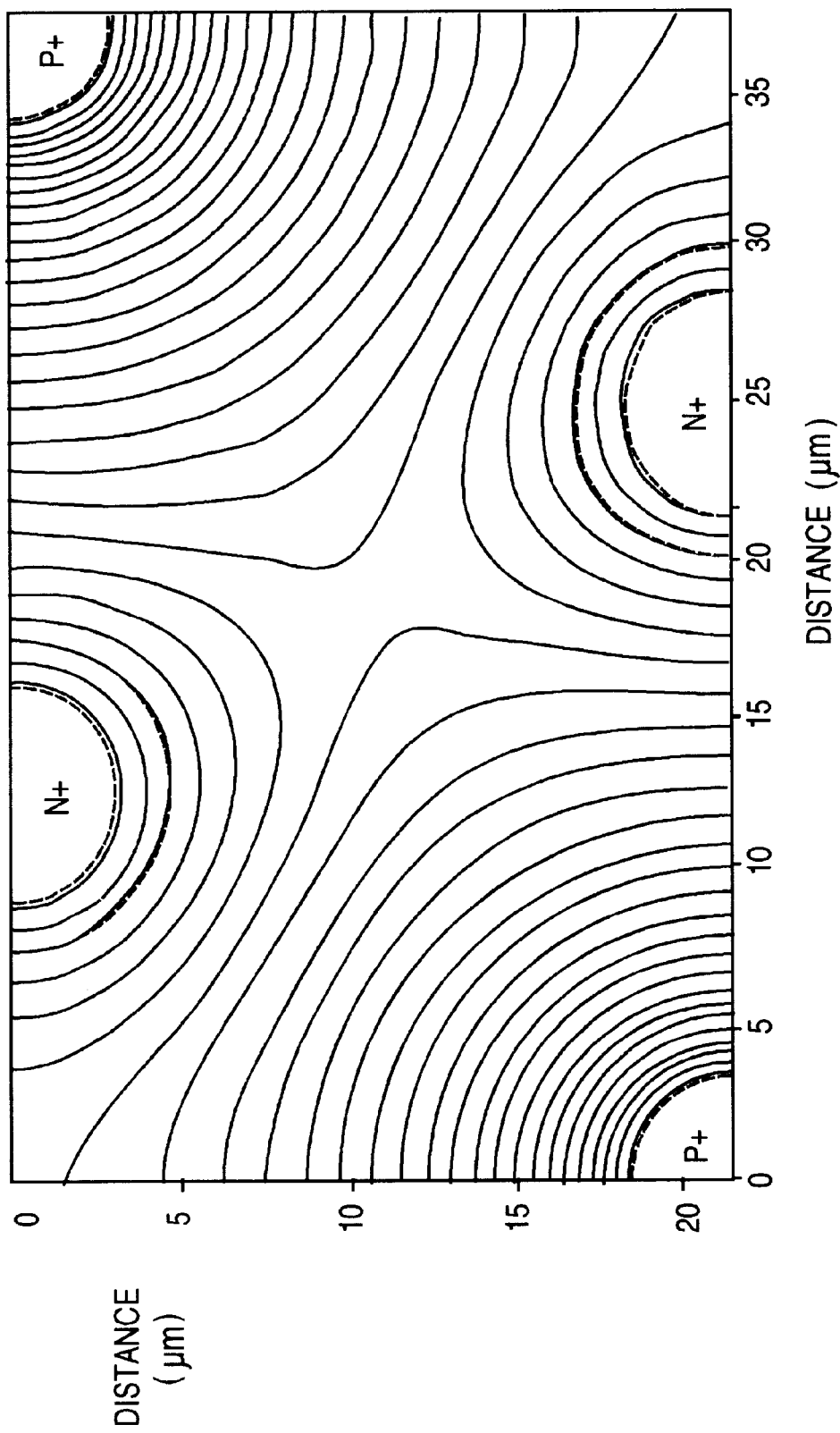

FIG. 13 depicts a potential distribution for the hexagon cell of FIG. 10C, for $10^{12}$ dopant atoms/cc, and 10 V applied bias. If detector 170 were fabricated using polysilicon electrodes 210 and/or 240, it might be beneficial to provide such electrodes having lengths L1, L2<L. This would be especially true if charge collection speed or efficiency for the small number of tracks that are fully contained in the electrodes was less than what is needed for a given application. In such an embodiment, substantially all tracks would generate signals in the region of silicon below the electrodes. Alternatively, one could fabricate two etched-through detectors that would then be glued together with an offset.

Small wells that cover only a portion of the upper substrate surface could be provided to hold simple driving electronics for a fast readout, such as might be used in a mammography detector, among other applications (see FIG. 2A). A two-dimensional readout could be provided using single-sided technology to fabricate electrodes that place differential signals on twin x and twin u or y lines that drive differential receivers. Advantageously, there would be negligible danger of interference between crossing signals, given the double subtraction at the crossing and at the receiver. Signal height would be nearly independent of strip length, and incoherent noise would grow no faster than the square root of the length. For small-angle stereo, readout would be allowed only from the ends since u lines reaching one edge could be crossed over the x lines and brought to the other edge, whence they would continue at their stereo angle.

The role of charge collection from electrodes in the present invention will now be described. Charge from tracks contained within electrodes will leave the electrodes by diffusion. In addition, if epi electrodes are used, charge will also leave because of the electric forces due to the built-in fields. Coulomb forces within the ionization charge cloud itself can either hinder or help charge collection, once part of the charge has been collected. For example, in the case of floating N+ electrodes, once some holes have diffused-out to the collection field and have been removed, the net negative charge will tend to attract the remaining holes, slowing their diffusion out of the electrode. If, however, the electrons have been collected by electronics coupled to the N+ electrode, there will be a net repulsion that will hasten hole collection.

Table 1, below, depicts pulse times for tracks at a radius r within an N+ electrode centered in a 50 $\mu$m×50 $\mu$m cell, a cell such as that shown in FIG. 2B for example. For polysilicon electrodes, the electric field within the electrode is assumed to come only from other holes (e$^-$ out—electrode coupled to electronics collecting the electrons) or from both holes and electrons (e$^-$ in). Estimated errors in the times range from 5% to 10%. For polysilicon electrodes, the time to collect 90% of the charge will be about three times that required to collect 50%.

TABLE 1

| track | r | 1.0 | 2.0 | 3.0 | 4.0 | 5.0 | $\mu$m |
|---|---|---|---|---|---|---|---|
| band | rmin | 0.0 | 1.5 | 2.5 | 3.5 | 4.5 | $\mu$m |
| | rmax | 1.5 | 2.5 | 3.5 | 4.5 | 5.0 | $\mu$m |
| band area | | 0.283 | 0.503 | 0.754 | 1.005 | 0.597 | % |
| cell area solid angle/$\pi$ | | 0.0025 | 0.0069 | 0.014 | 0.023 | 0.028 | % |
| time-epi | peak | 2.9 | 2.7 | 2.3 | 2.2 | 2.1 | ns |
| | .5$\Sigma$q | 3.1 | 2.7 | 2.3 | 2.1 | 2.0 | ns |
| time-poly, e out | peak | 4.5 | 4.1 | 3.5 | 2.4 | 1.9 | ns |
| | .5$\Sigma$q | 6.6 | 5.8 | 4.3 | 2.8 | 1.9 | ns |
| time-poly, e in | peak | 5.1 | 4.7 | 3.5 | 2.5 | 2.0 | ns |
| | .5$\Sigma$q | 8.3 | 6.8 | 4.7 | 3.1 | 1.9 | ns |

The fraction of tracks contained entirely within an electrode will depend upon the tracks' angular distribution, as well as upon the electrode cross-sectional area. Table 1 shows, for example, at row 4 the percentage of a 50 $\mu$m×50 $\mu$m square cell occupied by several radial bands for an N+ electrode between two p+ ones of FIG. 3C. Table 1 further shows the probability for the track to remain inside the band outer radius, for a beam distributed uniformly over $\pi$ steradians centered around the normal to the detector.

The probability for the entire track to stay within rmax is the product of the band area and solid angle factors. For a more tightly aligned beam, the product increases to that of the area fraction alone, although for very tightly aligned beams, the detector can be tilted, reducing the fully contained fraction to zero. The following two rows in Table 1 show the times to the pulse peak and to the 50% charge collection time for 10 V applied voltage and epi electrodes. The following two rows then show similar times for polysilicon electrodes (without the built-in fields), and with electrons collected by the attached electronics. Finally, the last two rows depict data for floating polysilicon electrodes, with the electrons left in the electrode. Tracks will also be contained within the P+ electrode and the two adjacent N+ electrodes, which will roughly triple the area fractions given in Table 1. The times for these electrodes will be shorter than the times for the N+ electrodes, tabulated above.

Having described the present invention in detail, several general conclusions and architectural design guidelines may be drawn. When it is necessary to minimize electric fields, electrodes forming diode junctions should have more total surface area than those forming ohmic junctions. N+ electrodes with phosphorus doping serve as getters, and preferably their electrode area is maximized, consistent with other design requirements. P—substrate material is preferred to prevent type change from bulk radiation damage, and indeed data exist indicating that P—silicon is less subject to bulk damage than N—material. (Bulk damage-induced type change may not be inevitably lethal in all implementations, however.)

According to the above design guidelines, a P—substrate should be used with a P electrode that transmits signals from the entire pixel, while PN diode junctions are formed between multiple N electrodes and the substrate. However, signals could be taken from the N electrodes, further subdividing the pixel and promoting faster signal collection speed. In practice, monolithic technology is likely to be needed for the smallest readout pitches, e.g., spaced-apart distances. With sufficiently fast electronic circuits, improved position and time information may also be provided by comparing the various P electrode and N electrode signal times and signal pulse heights.

In a bump-bonded pixel detector system, many N electrodes may be coupled together (e.g., with metal or diffusion conductive traces) to reduce the number of bumps required, and to provide a measure of redundancy. If IC chip area needed for on-chip electronics in the pixel causes pixel area to exceed the area of the underlying bulk cell, conductors may join P electrodes from one or more other cells to the pixel electronics. However, the penalties for so doing will include increased capacity $\Sigma C_i$, a reduced signal $q/\Sigma Ci$, and a reduced signal-to-noise ratio. In such case, a single, simple front-end circuit per cell with an input signal $q/C_i$ may be a better design choice. This design might be better because random noise of the sum increases, and signal-to-noise ratio decreases but at most only as the square root of the number of cells. (For example, if one source-follower from each cell were used to drive a common pixel bus, a follower with a signal will tend to cut off those without, and only the noise on that channel would be present.)

When on-wafer metal lines are used, preferably the outer faces of the electrodes are in contact with, and surrounded by, an implanted ring of like-polarity dopant to promote good contact. This practice is desired as the silicon surface directly above the electrodes may not be fully planar.

Silicon surfaces may be inverted by charges in surface field oxide layers. Thus, for a P-substrate, inversion could result in a continuous N conductor from the N electrodes to the immediate vicinity of the P electrodes. The resultant small gap could result in increased electrode capacity and electric fields. On one hand, this gap would be enlarged by the applied depletion voltage, but on the other hand, increased oxide charge due to radiation damage might reduce the gap. To prevent this, P+ guard rings may be formed around the P electrode car a blanket P implant may be used. Implanted rings are recommended for use in test devices to monitor surface leakage currents.

An exemplary sequence of process steps to produce bump-bonded diodes according to the present invention will now be given, in which routine wafer cleaning and process checking steps are not enumerated. Of course, even the enumerated steps may have many sub-steps, not listed here, and other fabrication steps and procedures may instead be used. For example, masking steps will involve spinning on photoresist, a low temperature bake, exposure in a mask aligner, photoresist development, a high temperature bake, the masked process per se (e.g., ion implantation or etching), and photoresist stripping. Even a simple sub-step such as spinning on photoresist will have its own sub-steps.

An exemplary fabrication process would include the following steps:

(1) Mask 1: alignment mark mask: and etch;
(2) Mask 2: N electrode mask and wafer etch-through;;
(3) N+ silicon deposition and hole fill (e.g., using a silane/phosphine gas mixture)
(4) Etch back deposited silicon on both wafer surfaces
(5) Mask 3: P electrode mask and wafer etch-through
(6) P+ silicon deposition and hole fill (e.g., using a silane/diborane gas mixture)
(7) etch back deposited silicon on both wafer surfaces
(8) Thermal oxidation (e.g., 0.6 $\mu$m oxide thickness)
(9) Etch oxide, backside
(10) Backside blanket P+ implant (optional step, to prevent oxide charges from inverting the adjacent silicon; alteratively, a masking step forming P+ rings to increase the N+/P+ separation could be used)
(11) Thermal oxidation (e.g., 0.6 $\mu$m oxide thickness, however if optional step 10 is omitted, steps 9 and 11 are also omitted.)
(12) Mask 4: front side N+ mask and implant to provide a planar ohmic contact to the N+ electrodes as silicon fill at the electrode surfaces will not necessarily be flat
(13) Mask 5: front side P+ mask and implant to provide planar ohmic contact to P+ electrodes and surrounding guard rings if rings are used to monitor current
(14) Anneal implants
(15) Low temperature oxide ("LTO") deposition
(16) Mask 6: contact mask and etch
(17) Aluminum deposition
(18) Mask 7: metal mask and etch In what is described in U.S. Pat. No. 5,889,313, the detectors were biased in a normal operating regime, with typically low voltage differentials between electrodes, e.g., perhaps 5 V. Using three-dimensional electrodes, maximum drift and depletion distances are set by the electrode spacings, rather than by the detector thickness, and smaller depletion voltages and shorter collection times result. Depletion voltages are about 1 V for net dopant concentration of about $10^{12}$/cm$^3$ and about 10 V for concentrations of about $5\times10^{13}$/cm$^3$ for a 300 $\mu$m thick p-type substrate with 10 $\mu$m diameter n-type electrodes extending vertically through the substrate. Electrode diameter and pitch will affect initial depletion voltage magnitudes. For conventional planar diodes fabricated on the same substrate, the same net dopant concentrations would require depletion voltages ranging from perhaps 50 V to 1100 V. Using the present invention, peak fields (located where the depletion region borders the highly doped electrodes) will be an order of magnitude below breakdown levels. Further, the peak fields can actually decrease under radiation, since a larger fraction of the voltage will appear across the increasingly highly doped substrate bulk. Computer simulation also shows that for the same total charge, signals from three-dimensional detectors can be thirty-times higher than signals detected using conventional planar architecture, with signal width being perhaps, 1.5 ns compared to perhaps 25 ns for planar devices.

However, it is now recognized, that increasing the inter-electrode potential sufficiently can force the detector into an avalanche mode regime, in which peak electric fields of perhaps 100,000 V/cm or more are produced. Using inter-electrode potentials of at least perhaps 100 V (compared with perhaps 5 V in conventional mode operation) can result in sufficiently high electric fields that will result in avalanche mode. Avalanche mode operation can also be promoted by using smaller diameter electrodes, perhaps a few Am as opposed to perhaps 10 $\mu$m. Avalanche mode operation can also be induced if the detector doping is carried out with arsenic, which tends not to diffuse overly far, which tends to form a sharp dopant profile near the collection electrodes. Further, abrupt junctions may be formed using epitaxial deposition of in situ doped silicon.

Avalanche photodiodes can produce avalanche gains of perhaps 1,000 to 10,000, but for many applications; a smaller gain would be useful, especially when attempting to detect particles or low energy radiation. By way of example, the detector structure shown in FIG. 2A may be biased to function in avalanche mode, for example by increasing inter-electrode bias voltages perhaps ten times over what was described in the U.S. Pat. No. 5,889,313.

In avalanche mode operation, a given number of input charges that drift into the collection electrodes can, if the electric fields are sufficiently high, give rise to many times that number of charges, e.g., an avalanche effect. The result is that the signal output by the detector, responsive to charge collection, can be substantially larger in magnitude than if non-avalanche mode operation were used. Radiation-induced signals that were too low to be detected with normally biased detectors may now be detected. Of, if desired, using avalanche mode biasing, less sophisticated readout electronics (e.g., circuit 60 in FIG. 2A) will suffice to signal process the detector output since a larger signal is provided from the detector.

As noted, avalanche mode operation is attained by creating relatively high electric fields, by providing a relatively high inter-electrode bias and/or by providing smaller diameter electrodes, although the electrodes need not of course be circular in cross-section. A polyfluorotetraethylene ("PFTE") or PFTE-like film may be employed to protect the wafer surface during formation of narrow electrode holes, which involves a long etch in aqueous HF solution similar to those used to produce macroporous silicon structures.

Especially small cross-section electrodes may be formed using a preferably photo-assisted electrochemical etch process. Such process would be similar to what is used to produce macroporous silicon in which pits are etched with KOH or an $SF_6$ plasma to serve as initialization points for the electrodes. The wafer would then be held at fixed potential relative to a solution of 2% to 5% dilute aqueous hydrofluoric acid. Light produces electron-hole pairs in the silicon, and the holes are attracted to the high energy field regions near the tips of the initialization pits on the opposite wafer surface. Etching of the silicon occurs only where holes are available, which results in a self-propagating hole.

To reduce the electric fields near the top and bottom detector surfaces, where the cylindrical or the trench avalanche electrodes meet the wafer surfaces, it may be useful to bevel the electrodes. By this it is meant that the electrode diameter or transverse dimension is gradually increased near the wafer surface to prevent generating higher electric fields (microplasmas) at the surface than are generated near the electrode boundaries within the bulk. This bevelling can be accomplished by first performing an isotropic plasma etch to form the top of an electrode hole, and then etching the remainder of the electrode hole with an anisotropic plasma etch. Alternatively, the first few microns (e.g., the depth preferably is similar to the electrode diameter) may be etched and then doped separately from the rest of the electrode. The junction dopant profile near the top (e.g., surface) can then be selected to produce much lower peak electric fields with little or no avalanche multiplication in that region.

Referring to FIG. 2A, it is now recognized that a non-conducting substrate 180 or a near-insulating substrate 180 may be used to fabricate the present invention, rather than a semiconducting substrate as disclosed in the U.S. Pat. No. 5,889,313. A detector made with such a substrate would be described as being conductor-insulator-conductor, and would be able to detect radiation-induced positive and negative charges, while affording essentially zero leakage current. Candidate materials for such a substrate 180 could include GaAs, diamond, ZnZnCe, $PbI_2$, and silicon carbide.

Figure 14A:
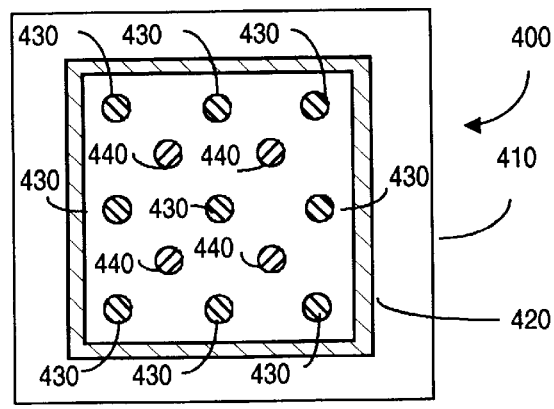
FIG. 14A is a plan view of a detector assembly comprising interleaved p-type and n-type electrodes surrounded by a peripheral partially filled and doped trench, according to the present invention.

Turning now to FIG. 14A, another new embodiment of a detector 400 according to the present invention is depicted. Detector 400 is shown fabricated on a portion of substrate 410, which as noted above may but need not be a semiconductor. In what will define the periphery of detector 400 (upon completion of fabrication), a trench 420 is formed, preferably by etching. The trench depth may be that of substrate 410, for example several hundred $\mu m$, perhaps 300 $\mu m$. In FIG. 14A, trench 420 has a square-like cross-section, but the cross-section need not be square, or rectangular, or necessarily have straight edges. (As will be described, various detectors 400 can be tiled together and it can be helpful to have useful trench perimeter shapes, for example a hexagon.) Typical dimensions for a trench as shown in FIG. 14A might be up to perhaps a cm or so on each trench side. The trench wall thickness will typically be as thin as a few $\mu m$, perhaps 5 $\mu m$, and may be as wide as 1 mm or more.

After the trench is formed in wafer 410, it is preferably partially but not completely filled, for example with polysilicon. The polysilicon or other fill material is doped, either during or after deposition. Fabrication steps used to make the trench are similar to those described to form three dimensional electrodes.

Within the area encompassed by the trench will be interleaved preferably three-dimensional p-type electrodes and n-type electrodes. For example, hollow-filled trench 420 might be doped with n-type dopant, whereas electrodes 430 might be p-type, and interleaved electrodes 440 are n-type. (If desired, all polarities could be reversed.) For ease of illustration, electrodes 430 and 440 are depicts with circular cross-sections, although other cross-sections could instead be used, including irregular cross-sections. Electrodes 430 and 440 may be fabricated as described in the U.S. Pat. No. 5,889,313. Construction is such that doping polarity of the active trench will be opposite to doping polarity of the nearest electrodes. Thus in FIG. 14A, p-type electrodes 430 are those closest to trench 420, which is n-type doped. Bias polarity is such that the doped trench is reverse biased relative to the nearest electrodes. Magnitude of trench bias potential may be similar to that used for the p-type or the n-type electrodes.

Figure 14B:
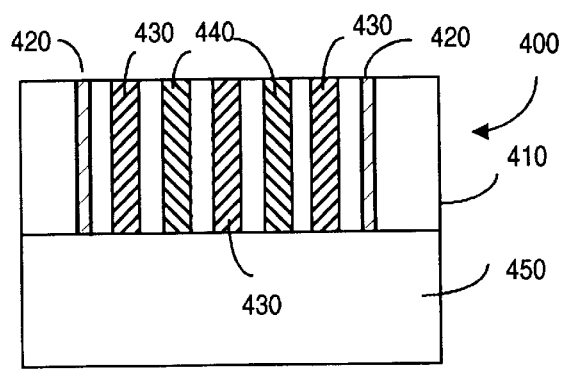
FIG. 14B is a side sectional view of the assembly of FIG. 14A, also showing the support wafer, according to the present invention.
Figure 14C:
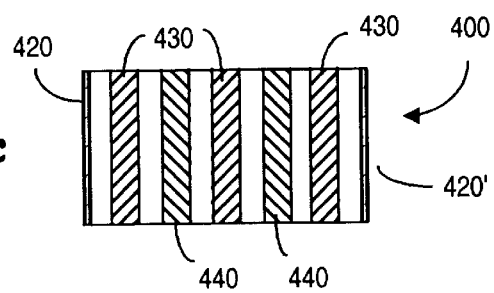
FIG. 14C is a side sectional view of the detector portion of the assembly of FIG. 14B after the outer shell portion of the trench electrode has been removed and the support wafer has been removed, according to the present invention.

As best seen in FIG. 14B, wafer portion 410 may be disposed on a holding or supporting wafer 450 during fabrication. Turning now to FIG. 14C, the supporting wafer 450 has been removed, and a saw (or other means) has been used to cut trench 420 vertically through approximately the center of the trench walls. If the trench walls are sufficiently wide the saw cut need not be centered, but should not damage the interior sidewall portion of the trench, e.g., that portion nearest to an electrode 430 in FIG. 14B or 14C.

Figure 15:
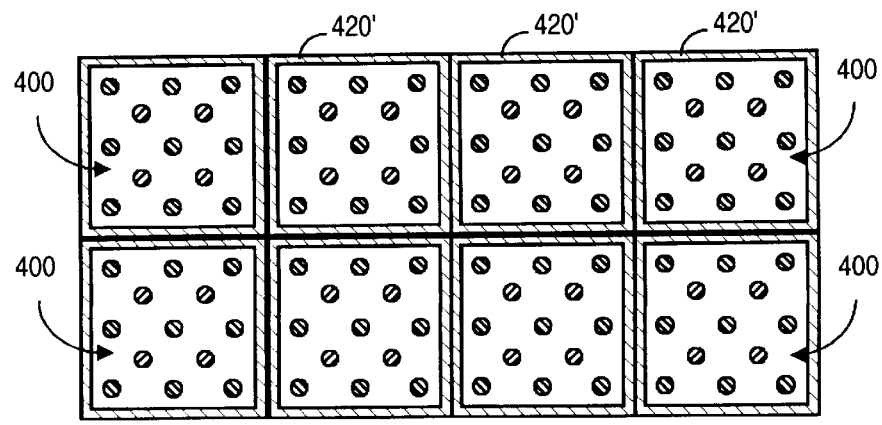

Note that detector unit 400 in FIG. 14C can operate as has been described with respect to FIG. 2A (among other figures), but detector 400 is surrounded by an active trench wall that can itself act as an element. In FIG. 15, a plurality of detector units 400 (as shown in FIG. 14C, after being freed from the exterior shell portion of the trench, and from the support wafer) are shown joined together to define a larger detector array. This tiled array can be formed as a single plane with essentially no dead edge regions, in contrast to prior art configurations that are stacked and have dead, non-detecting, regions. The dimensions for a typical single tile 400 may be as small as perhaps 1 mm on a side to as large as perhaps 10 cm.

In FIG. 15, adjacent trench sides of detector units 400 are electrically coupled to bias source(s), for example with wire bonds. The back surfaces of the various tile units 400 may be glued or otherwise attached to a common support. In FIG. 15, the differential bias between the interleaved rod-like p-electrodes and n-electrodes will be typically on the order of perhaps 5 V to 10 V (unless avalanche mode is used, in which case the differential voltages will be perhaps 100 V or more). The differential between the n-trench and the interleaved p-electrodes may be the same as the differential between the n-electrodes and the p-electrodes, or some other differential potential.

The essentially seamless edge-to-edge detection and potentially large area detection provided by the configuration of FIG. 15 lends itself to medical and research applications. A detector area sufficiently large to capture images of the human chest can readily be fabricated according to the present invention. Further, the present invention lends itself to synchrotron studies of proteins for viruses and the like, in which the subject material is crystallized and subjected to monochromatic synchrotron light to produce Bragg scattering. By causing the scattered image to fall upon applicants' detector array, the Bragg scattering can be analyzed to reconstruct the three-dimensional structure of protein under examination to better understand viruses.

In yet another embodiment, applicants use polyfluorotetraethylene ("PFTE") or PFTE-like material, or fluorocarbon polymers that is formed into a thin film that is deposited upon the surface of an IC, preferably using a plasma reactor. Various fluorocarbon gases (e.g., $C_4F_8$, $CHF_3$, $C_4F_{10}$, $CF_4$, etc.) may be used to deposit the film. The gas is ionized by supplying energy via an RF electric field, for example at 13.56 MHz, as is common in the industry. The procedure may be carried out somewhat similar to methods used to coat silicon wafers with PFTE or PFTE-like films for the purpose of reducing surface friction.

PFTE and PFTE-like materials may be masked using standard photoresist and photolithography, and may then be patterned by etching in an oxygen plasma, or a fluorine-containing plasma, e.g., a plasma with $SF_6$.

If desired, instead of using a plasma-deposited film of PFTE or PFTE-like material, applicants have discovered that one can coat a wafer with standard photoresist that may be left as a blanket coating or perhaps patterned, e.g., using photolithography as described above. The photoresist is then hardened by exposure to a fluorine-based plasma. The result is a chemically tough surface film that is resistant to chemical attach by common anisotropic silicon etchants, e.g., KOH, TMAH (tetramethyl amonium hydroxide). After silicon etching of the subject wafer is complete, the PFTE or PFTE-like film may be removed, for example, using a short oxygen-plasma clean cycle. Alternatively, the film may be left on as a protective layer. Such films are fairly transparent and are very conformal, and can coat surfaces that are perpendicular to the major surface of a wafer.

Applicants have discovered that pre-deposition and post-deposition treatment helps the PFTE material adhere to the wafer. A preferred procedure to provide a clean wafer surface is to use a hot sulfuric peroxide soak followed by a 150° C. bake prior to deposition of the PFTE. After deposition, a heat treatment at 150° C. for thirty minutes further improves adhesion of the PFTE film to the wafer.

The film layer is exceptionally resistant to concentrated acids, alcohols, aldehydes, bases, esters, aliphatic hydrocarbons, aromatic hydrocarbons, halogenated hydrocarbons, ketones, most oils and oxidizing agents. The high chemical resistance of the film makes it a useful coating for circuitry and sensors that must function in chemically hostile environments, including semiconductor processing baths, chemical and pharmaceutical processes. Further the film is easily sterilized via autoclaving, gas, dry heat, or chemical disinfectants, and may find use in medical applications including sensors.

Applicants have also discovered that the PFTE or PFTE-like material may be formed as micro-sieve or nano-sieve to filter particulate matter from solutions and gases, including ambient air. In a biological application, such sieves might be used to filter out biological matter. Chemically inert membrane screen having micron or sub-micron openings may be formed in at least three ways, according to one aspect of the present invention.

In a first method, an array of openings (circular, square, arbitrary cross-section, non unlike the electrodes herein) is etched through a wafer and the resultant structured is coated with a thin layer (tens of $\mu$m to 100 Å) of plasma-deposited fluorocarbon polymer (polytetrafluoroethylene). The wafer may be silicon, or could be silicon nitride, silicon carbide, silicon dioxide, among other materials. This supporting wafer may be etched using wet chemical etch such as that used in forming porous silicon, or using plasma etch, e.g., a Borsh process.

In a second method, inert membranes are formed by depositing a layer of fluorocarbon polymer of a desired thickness (perhaps up to many tens of microns) on a wafer. Photoresist is then spun on and patterned, using standard photolithography or electron-beam lithography. Using the photoresist, the polymer layer is mask patterned using an oxygen plasma. The supporting (silicon) wafer may then be etched away, yielding a free polymer membrane with an array of tiny holes in a well defined geometry.

In a third method, a hole may be filled with plasma deposited PFTE polymer, after which the polymer is ejected from the mold, or the mold is dissolved. Such a mold might be formed from silicon, metals, or other organics such as PMMA. By way of example, a LIGA process might be used if the electro-deposited metal is replaced by applicants' PFTE polymer.

Screen membranes formed according to the present invention can have a polymer thickness that is finely controlled from tens of angstroms to hundreds of microns, in contrast to prior art magnitudes of control. Further, such membranes are compatible with standard micro-electronic and micro-electromechanical system fabrication, which permits monolithic integration. The membranes are formed using low-temperature, high-vacuum, and are highly conformal. As noted, the holes may have arbitrary cross-section, and different holes can have different cross-sections.

Such screen membranes may be incorporated during manufacture of microfluidic systems, for use in medicine and biology. Advantageously, such membranes would have the properties of bulk polytetrafluoroethylene including being chemically inert, having high melting point and high electrical resistivity, low surface friction, hydrophobic characteristics, functionality at cryogenic temperatures and such membranes may be used in an autoclave. Further, the membranes are gas and heat sterilizable and could be used to filter out bacteria including, possibly, viruses, large organic molecules, and particulates.

Turning now to FIGS. 16A–22, yet another embodiment of the present invention is depicted, wherein one IC chip may be joined to a second, perhaps larger chip. The discrete wafers are joined to each other, electrically and/or mechanically, using a vapor deposition bonding process.

A typical application within the present invention might be to bond a wafer with detectors or multiple detector wafers to a perhaps larger single wafer with readout or other signal processing electronics. Alternatively, multiple readout ICs might be bonded to a larger detector IC. Bonding could be carried out at the wafer level or at a die/chip level. Chip level vapor bonding would tend to increase the yield of the final device and is preferred.

The described bonding method appears to achieve bonding at the atomic level between the joined wafer structures. The resultant interconnections are superior to those achieved using prior art techniques such as bump bonding.

FIG. 16A depicts a substrate 500 with a thick oxide layer 510A on the upper surface, and 510B on the lower surface, while FIG. 16B is a top plan view showing upper surface oxide layer 510A. Typically substrate 500 has a thickness of several hundred microns, for example 700 $\mu$m, primarily because a substantially thinner substrate might fracture during IC fabrication. Typically the IC formed on substrate 500 will have an upper metal layer of aluminum 520, a metal whereon aluminum oxide readily forms. Unfortunately this oxide is difficult to etch or otherwise remove readily during subsequent processing, which can comprise the integrity of inter-wafer bonding according to the present invention. Thus applicants prefer to remove the aluminum oxide in FIG. 16A, for example by sputter chamber cleaning and deposit tungsten on the now clean aluminum. An oxide will form on the tungsten, but this oxide is more readily removed than would be aluminum oxide. Thus in FIG. 17A, deposition and patterning has occurred, aluminum metalization 520 has been cleaned and tungsten 530 deposited thereon. FIG. 17B is a plan view showing the tungsten layer surrounded by field oxide.

In FIGS. 18A and 18B, a relatively thick layer of deposited and patterned low temperature oxide 540 has been formed. Note that oxide 540 is taller than any other structure on the upper surface of substrate 500. In FIG. 19, a cavity 545 has been formed in substrates 500. Thick oxide 540 and silicon in substrate 500 have been anisotropically via etched. The resultant structure is referred to as element 550.

As will be seen, uppermost surfaces of oxide 540 will eventually be fusion bonded to oxide surfaces on a mating IC, e.g., 560 in FIG. 20. Surfaces that will be fusion bonded preferably will have been smoothed to a level of perhaps 10 nm, if not better. Thus before or after the low temperature oxide deposition (shown in FIGS. 18A and 18B) the wafer upper surfaces will have been polished using chemical mechanical polishing, if needed. In some instances the surfaces may already be sufficiently smooth not to require such polishing.

It will be appreciated that there may be many structure 550-like regions on an IC wafer, according to the present invention; however for ease of illustration only the relatively simple configuration of FIG. 19 is shown. Assume that multiple structures 550 (not all of which need be identical or even similar) are to be bonded to a common IC 560.

For ease of illustration, FIG. 20 shows a single second common IC 560 that is the same size as structure 550. Preferably the outer dimensions of structure 550 and 560 are precisely controlled in that plasma cutting rather than cruder saw cutting is used to separate the structures from their parent wafer(s). Thus, the overall dimensions, e.g., in the horizontal plane in FIG. 20, of the structures may be controlled within a very few microns. Saw cutting instead of plasma cutting could be used to size the structures, but with less dimensional accuracy.

Prior to bonding the two structures, all particulate matter was removed from the upper surfaces of structures 550 and 560, since even micron diameter particles on the surface can cause mm diameter unbonded regions. The surfaces were preferably oxidized in steam, and soaked in a 90° C. $H_2SO_4$–$H_2O_2$ solution followed by a dump rinse and a spin rinse. At this juncture, the surfaces were coated with Si-OH groups.

A jig 560 having a preferably chamfered or enlarged mouth opening is provided to force structures 550 and 560, with their now cleaned surfaces, into good alignment. Thus, the side-to-side opening in jig 560 is made only a few microns larger than the nominal structure size plus largest anticipated margin in size. The jig thus forces structure 560 and structure 550, which is inverted top-to-bottom, to align quite well with each other. By good alignment it is meant that contact regions in one structure that are to be electrically and/or mechanically connected to corresponding contact regions in the other structure are in close mechanical alignment. Thus, in the simple depiction of FIG. 20, tungsten coated contact 530' in structure 560 is in good mechanical alignment with tungsten coated element 530 in structure 550.

In FIG. 20, the interface between structures 550 and 560 is formed by the oxide layer 540 on structure 550 and oxide layer 540A on structure 560. Even at room temperature, hand pressure that urges the two aligned structures together for a few seconds is sufficient to begin a wave of fusion bonding between these two oxide layers that traveled radially out from the point where pressure was applied. The initial bonding occurs at room temperature, after which the bonded together structure may be removed from the jig and IR-tested, a test in which interface voids will appear as rings. Hydrogen bonds, initially formed via water bridging, can then be converted with heat to siloxane bonds: SiOH+HO—Si→Si—O—Si+$H_2O$ as the water is driven off or sequestered in the oxides. A temperature of 350° C. for 30 minutes appears to provide sufficient long term bonding, although baking for several hours will provide a highest bond strength.

The above described method preferably uses an inexpensive jig and spacers to create alignment between ICs to be fusion bonded. Of course commercial die and wafer bonding equipment in which optical alignment is used could be employed, but at greater cost.

As noted, structure 560 may in fact be substantially larger than individual ones of attached structures 550. By way of example, assume in FIG. 20 that the left-to-right dimension of structure 560 is increased in length to accommodate say ten side-by-side structures 550, and that the left-to-right dimension (in FIG. 20) of jig 560 is also increased to accommodate ten such structures. A spacer-structure (not shown) that is precisely sized to have a left-to-right dimension of nine times the width of structure 560 is first put in the jig and moved to the far right so as to cover 90% of the upper surface of structure 560, starting from right-to-left. Next, structure 550 is lowered into the jig, and will precisely align itself with the leftmost edge of structure 560. If desired, structure 550 can now be hand urged downward into contact with the leftmost upper surface of structure 560 to begin bonding.

Next, the "nine-width" spacer is removed from the jig and say an "eight-width" spacer is inserted with its rightmost edge urged against the rightmost vertical jig edge. Next a second structure 550 (or more precisely, a structure having the same left-to-right dimension as the area now present between the right edge of the first inserted structure 550 and the left edge of the "eight-width" spacer) is placed in alignment with the exposed portion of structure 560 and can be hand urged into initial bonding. Next the spacer is removed, and so forth. Assume that the next structure 550 is in fact twice as wide as the first structure 550. At this point a spacer that is as wide as six of the original structure 550s (e.g., a "six-width" spacer) is lowered into the jig with its right edge against the right edge of the jig. The only exposed region of the upper surface of the large structure 560 will be a two-width region between the first two mounted structures 550 and the six-width spacer. This process may be repeated to precisely mount and align multiple upper structures 550 to a larger lower structure 560.

In FIG. 21, a substantial thickness of the sacrificial substrate 500 has been removed, thus thinning down structure 550 and exposing cavity 545. The thickness of the thinned down substrate 500 is now perhaps 20 μm. It will be appreciated that the original thickness of substrate 500 will have served to protect structure 550, perhaps a readout IC, during the various process steps that have been described. Thinning down can be accomplished using chemical mechanical polishing, or etching, among other techniques. By way of example, FIG. 21 depicts a protective film 590 of PFTE or PFTE-like material, as has been described herein. Such film can protect the external vertical and base surface of the overall structure during any wet alkaline etch. Less protection might be afforded for plasma etching, but then plasma etching would tend to affect only one side of the wafer or die, whereas a wet etch could attack all exposed surfaces.

Note in FIG. 21 that a gap 580 exists between the regions that wish to be electrically interconnected. However in FIG. 22, a chemical vapor deposition of tungsten has been carried out, which completes the electrical contact between the two tungsten regions 530 and 530'. (Tungsten selectively can deposit upon itself.) In FIG. 22, PFTE or PFTE-like film 560 is shown removed, but could be left in place to provide protection. If desired, after all fabrication steps are complete, the top surface of the resultant structure 610 shown in FIG. 22 can be protected with photoresist, primarily to protect: the region near the edges. Structure 610 can then be placed face down in an etcher while support substrate 500' is thinned, if desired, by etching.

From FIGS. 16A–22 it will be appreciated that a great number of electrical connections, thousands if not more, can be precisely achieved with a yield that is very close to 100%. Further, the joined-together ICs are in intimate contact, mechanically and electrically. By contrast, bump bonding or flipchip type interconnections would have a yield of only perhaps 90%. Understandably, the difference in yield between 90% in the prior art and 99% or 100% in the present invention is very significant when tens of thousands of interconnections are being made.

Modifications and variations may be made to the disclosed embodiments without departing from the subject and spirit of the invention as defined by the following claims. For example, a GaAs detector fabricated according to the present invention should realize collection times of 1 ns or substantially less, maximum drift distances should no longer be a significant limitation for such detectors.

What is claimed is:

1. A method of fabricating a radiation-damage resistant radiation detector, comprising:

providing a substrate having a first surface and a second surface spaced-apart by a substrate thickness;

forming at least one first electrode, with a first conductivity type dopant, that penetrates from either surface into said substrate; and forming at least one second electrode, spaced-apart from said first electrode and formed with a second conductivity type dopant, that penetrates from either surface into said substrate;

wherein at least one said electrode is formed to penetrate a distance into said substrate ranging from about 5% to 100% of said substrate thickness; and wherein said detector is biasable to operate in avalanche mode or to operate in non-avalanche mode.

2. The method of claim 1, further including:

forming at what is to be a perimeter of said detector a conductive trench that is doped with a conductivity type dopant opposite in conductivity type dopant to at least some of whichever of said first electrode or said second electrode that is closest to said trench has been doped with;

said trench having a trench depth at least as great as any of said first electrode and said second electrode;

wherein said trench forms a periphery of said detector and said detector is detection-active from detector edge-to-edge.

3. The method of claim 1, further including:

forming at what is to be a perimeter of said detector a conductive trench that is doped with a conductivity type dopant same as conductivity type dopant to at least some of whichever of said first electrode or said second electrode that is closest to said trench has been doped with;

said trench having a trench depth at least as great as any of said first electrode and said second electrode;

wherein said trench forms a periphery of said detector and said detector is detection-active from detector edge-to-edge.

4. The method of claim 2, wherein forming said trench includes:

etching into said substrate a trench having an inner wall facing toward said first electrode and said second electrode, and having an outer wall facing away from said first electrode and said second electrode;

partially filling said trench with a material selected from a group consisting of (a) a material that can be doped after partially filling said trench, (b) a material that can be doped while partially filling said trench, and (c) a polysilicon material; and removing said outer wall from said trench.

5. The method of claim 1, wherein:

said substrate has a characteristic selected from a group consisting of (a) said substrate is a semiconductor, (b) said substrate is a semiconductor doped with said first conductivity type dopant, (d) said substrate is a semiconductor doped with said second conductivity type dopant, (e) said substrate is an insulator, (f) said substrate is diamond, (g) said substrate is GaAs, and (h) said substrate is silicon carbide.

6. The method of claim 1, further including:

forming at least one said electrode with a dopant profile that is radially graded in a direction parallel to a surface of said substrate.

7. The method of claim 1, wherein fabrication of said detector includes the following steps:

(a) covering a surface of said substrate with a first mask defining a first plurality of openings that will define a location for each said first electrode; and (b) using a high energy ion implanter, implanting said first conductivity type dopant through each said opening to form said first plurality of said first electrodes.

8. The method of claim 7, wherein fabrication of said detector further includes the following steps:

(c) covering a surface of said substrate with a second mask defining a second plurality of openings that will define a location for each said second electrode; and (d) using a high energy ion implanter, implanting said second conductivity type dopant through each said opening to form said second plurality of said second electrodes.

9. The method of claim 1, wherein fabrication of said detector includes the following steps:

(a) defining at least partially through said substrate a hole for each said first electrode; and (b) exposing each said hole formed in step (a) to chemical vapor deposition of a gas that includes said first conductivity type dopant.

10. The method of claim 9, wherein fabrication of said detector further includes the following steps:

(c) defining at least partially through said substrate a hole for each said second electrode; and (d) exposing each said hole formed in step (c) to chemical vapor deposition of a gas that includes said second conductivity type dopant.

11. The method of claim 5, wherein at least one of said first electrode, said second electrode, and said trench is formed using at least one material selected from the group consisting of (i) polysilicon that is doped, (ii) epitaxial silicon that is doped, (iii) trimethyl gallium and arsine, and (iv) material appropriate for a substrate other than silicon or gallium arsenide.

12. The method of claim 1, wherein said first electrode and said second electrode have a spatial relationship selected from the group consisting of (i) said first electrode and said second electrode penetrate into said substrate from opposite surfaces of said substrate, (ii) said first electrode and said second electrode each penetrate into said substrate from a common surface of said substrate, (iii) said first electrode penetrates more deeply into said substrate than does said second electrode, (iv) said first electrode penetrates from said first surface through said substrate into said second surface, and (v) each said electrode penetrates from said first surface through said substrate into said second surface.

13. The method of claim 2, further including:

forming a plurality of said detectors, each of said detectors including interleved first electrodes and second electrodes disposed in an area whose periphery is said trench; and forming a planar array of said detectors to define a large detector that is detector active from array edge-to-edge.

* * * * *